(12) United States Patent
Sokolov et al.

(10) Patent No.: US 8,324,938 B2
(45) Date of Patent: Dec. 4, 2012

(54) SELF-TIMED TRIGGER CIRCUIT WITH SINGLE-RAIL DATA INPUT

(75) Inventors: Igor Anatolievich Sokolov, Moscow (RU); Yury Afanasievich Stepchenkov, Moscow (RU); Yury Georgievich Dyachenko, Moskovskaya oblast (RU)

(73) Assignee: Institute of Informatics Problems of the Russian Academy of Sciences (IPI RAN), Moscow (RU)

( * ) Notice: Subject to any disclaimer, the term of this patent is extended or adjusted under 35 U.S.C. 154(b) by 92 days.

(21) Appl. No.: 12/937,909

(22) PCT Filed: Apr. 13, 2009

(86) PCT No.: PCT/RU2009/000175
§ 371 (c)(1),
(2), (4) Date: Oct. 14, 2010

(87) PCT Pub. No.: WO2009/128746
PCT Pub. Date: Oct. 22, 2009

(65) Prior Publication Data
US 2011/0043252 A1 Feb. 24, 2011

(30) Foreign Application Priority Data
Apr. 15, 2008 (RU) ................................ 2008114199

(51) Int. Cl.
*H03K 19/20* (2006.01)
*H03K 19/173* (2006.01)
(52) U.S. Cl. .......................................... 326/104; 326/38
(58) Field of Classification Search .................. 326/104, 326/46
See application file for complete search history.

(56) References Cited

U.S. PATENT DOCUMENTS

| | | | |
|---|---|---|---|
| 5,327,019 A * | 7/1994 | Kluck | 327/202 |
| 6,617,901 B1 | 9/2003 | Kuhn | |
| 7,109,772 B2 | 9/2006 | Tohsche | |
| 7,739,628 B2 * | 6/2010 | Manohar et al. | 716/103 |
| 7,870,516 B2 * | 1/2011 | Sotiriou et al. | 716/103 |
| 2007/0001727 A1 * | 1/2007 | Wielage | 327/202 |
| 2009/0210847 A1 * | 8/2009 | Manohar et al. | 716/12 |
| 2010/0205571 A1 * | 8/2010 | Manohar et al. | 716/3 |

FOREIGN PATENT DOCUMENTS

DE 10250866 A1 5/2004
(Continued)

OTHER PUBLICATIONS

Shilo, V.L. "Popularnye Tsifrovye Mikroskhemy" (Popular Digital Microcircuit) Reference Book, 2nd Ed., corrected, Chelyabinsk Metallurgy, Chelyabinsk Branch Office, 1989 (3 pgs.); English translation—1 pg.

(Continued)

*Primary Examiner* — Thienvu Tran
(74) *Attorney, Agent, or Firm* — Volpe and Koenig, P.C.

(57) ABSTRACT

A self-timed implementation of single-stage and two-stage self-timed trigger circuits with single-rail data input is provided. This is achieved by a circuit containing storage unit with element indicating transition termination, single-rail data input, control input, data output, and indication output, into which a conversion unit is added which converts single-rail data input and control input signals and has data input, control input, data output and control output. An additional feedback output allows for speeding-up transition of device, which is a source of the single-rail data input of the trigger.

29 Claims, 21 Drawing Sheets

FOREIGN PATENT DOCUMENTS

| | | | |
|---|---|---|---|
| RU | 2319297 | * | 3/2008 |
| RU | 2319297 C1 | | 3/2008 |
| RU | 2362266 C1 | | 7/2009 |
| RU | 2362267 C1 | | 7/2009 |
| RU | 2365031 C1 | | 8/2009 |
| RU | 2366080 C2 | | 8/2009 |

OTHER PUBLICATIONS

Edited by Varshavsky, V.I. "Aperiodichekie Avtomaty" (Aperiodic Automatic Machines) The Nauka (Science Publishers, The Chief Editors of Physical and Mathematical Literature Moscow 1976 (7 pgs.); English translation—3 pgs.

* cited by examiner a) Self-timed trigger with an external environment (EE)
b) Signal graph for trigger with EE

SELF-TIMED TRIGGER CIRCUIT WITH SINGLE-RAIL DATA INPUT

BACKGROUND OF THE INVENTION

A self-timed trigger circuit with single-rail data input refers to pulse and computational technique and may be used for designing self-timed trigger circuit, register and computational units, as well as in digital signal processing system as both storage cell and interface between synchronous and self-timed parts of one design.

There is known trigger [1] consisting of four AND-NOT elements and inverter.

Disadvantage of this trigger is an absence of means of transition termination indication.

The nearest to the suggested solution by technical nature and accepted as a prior art is the self-timed trigger circuit [2] containing storage unit which consists of bistable cell on base of AND-OR-NOT elements with paraphase data input and output, and indication element AND-OR-NOT.

Disadvantage of prior art is that it works only with paraphase or dual-rail data, which double a number of data connections between multibit input data source and register on base of such trigger, and does not allow to use it as an element of interface between synchronous and self-timed circuits.

SUMMARY OF THE INVENTION

A problem resolved in this invention consists in providing self-timed implementation of trigger circuit with single-rail data input guaranteeing its delay-insensitive operativeness.

This goal is succeeded due to that trigger consisting of storage unit, single-rail data input, control input, data output and indication output, and storage unit has direct and inverse components of paraphase data input, control input, data output and indication output, data output of the storage unit is connected to the trigger's data output, direct component of paraphase data input of the storage unit is connected to trigger's single-rail data input, indication output of the storage unit is connected to the trigger's indication output, the block of converting both information signal and control signal (further simply conversion unit) is added which has data input, control input, data output and control output, and data input of conversion unit is connected to trigger's single-rail data input, control input of conversion unit is connected to trigger's control input, data output of conversion unit is connected to inverse component of paraphase data input of the storage unit, control output of the conversion unit is connected to the control input of the storage unit.

The suggested device satisfies criterion "essential differences". A usage of conversion unit for transforming single-rail signals into paraphase one is known. However, here it includes also a transformation of trigger's control input, and this provides obtaining an effect expressed by the goal of invention.

So far as added construction connections do not known in analogous technical solutions, this trigger may be considered as having the essential differences.

BRIEF DESCRIPTION OF THE DRAWINGS

FIG. 8 presents the storage unit implementation of a single-state trigger with paraphrase data input and with low work level that.

DETAILED DESCRIPTION OF THE PREFERRED EMBODIMENT

Figure 1:
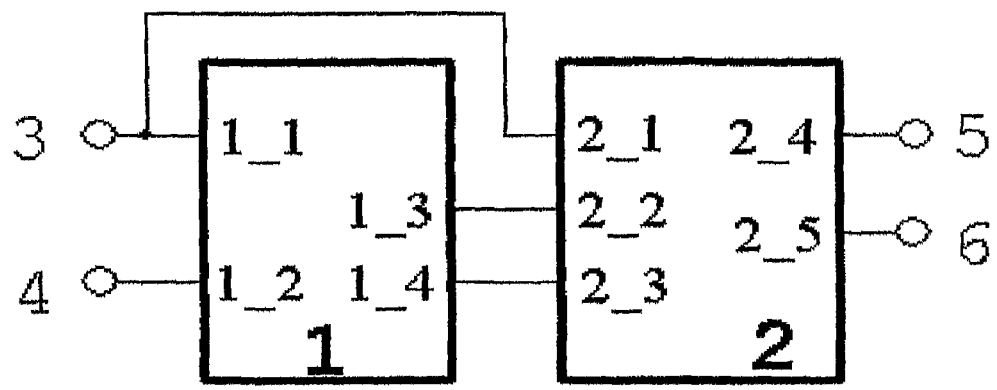
FIG. 1 presents a circuit of the self-timed trigger with single-rail data input.

A circuit of the self-timed trigger with single-rail data input is shown in FIG. 1.

The circuit consists of conversion unit 1, storage unit 2, single-rail data input 3, control input 4, data output 5, indication output 6, trigger's single-rail data input 3 is connected to data input 1_1 of the conversion unit 1 and to the direct component of paraphase data input 2_1 of the storage unit 2, trigger's control input 4 is connected to the control input 1_2 of the conversion unit 1, data output 1_3 of the conversion unit 1 is connected to the inverse component of paraphase data input 2_2 of the storage unit 2, control output 1_4 of the conversion unit 1 is connected to the control input 2_3 of the storage unit 2, data output 2_4 of the storage unit 2 is connected to trigger's data output 5, indication output 2_5 of the storage unit is connected to trigger's indication output 6.

Circuit operates as follows. Single-rail data signal comes onto trigger's input 3, and control signal comes onto input 4. Conversion unit complements trigger's single-rail data input by its inverse component and corrects control signal thus providing self-timing of the trigger transitions. Transformed signals together with trigger's single-rail data input are applied to the inputs of the storage unit. Control signal enables or disables writing down data inputs of the storage unit into its internal state. For example, at high level of the control signal the storage unit writes down and keeps a state of the data inputs, and stores its own state at low level of the control signal. Storage unit contains indicator, which fixes a termination of the transitions in all elements of the trigger. An output of the indicator can be in one of two states, first of which, for example, is high and corresponds to termination of writing down new state into the trigger, i.e. a work trigger phase, while another, low state, corresponds to termination of the trigger preparation for reception of new data, i.e. spacer phase. Conversion unit provides proper single-rail data signal transformation and corrects trigger's control input taking into consideration a value of the single-rail data input in order to guarantee a faultless storing given state in the storage unit as well as successful indication of both phases of trigger operation.

The peculiarities of this trigger comparing to prior art are as follows.

Trigger's data input is single-rail that allows for using trigger as a component of interface between synchronous and self-timed circuits and cuts by half number of data wires between data sender and receiver in self-timed circuits. This simplifies a problem of circuit traceability on a chip or plate at general system implementation. Besides, an unpaired (single-rail) data output provides cascading of such triggers at building pipeline structures in self-timed circuits with minimal number of data wires between them.

Thus, suggested trigger provides self-timed work with single-rail data input. The goal of invention is succeeded.

A practical technical implementation of suggested trigger and of its components depends on both control input type: does high or low its work level enable writing down new state into the storage unit, —and functional designation of the trigger. Control input type determines an implementation basis of the conversion and storage units: AND-OR-NOT or OR-AND-NOT gates. Functional designation determines a method of storage unit implementation—on base of single or two bistable cells. In first case storage unit is used for implementing self-timed latch. In second case storage unit is used for implementing self-timed flip-flop.

Conversion unit is common for all triggers with a single-rail data input. Its implementation is identical for all triggers with the same control input type.

Figure 2:
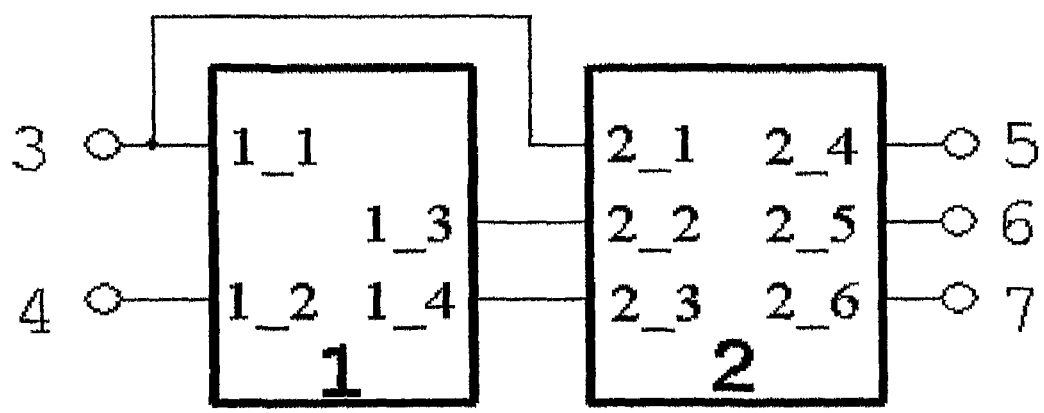
FIG. 2 demonstrates the self-timed trigger circuit differing from the circuit in FIG. 1 by a presence of trigger's inverse data output.

At designing self-timed circuits, single data output not always is sufficient as traditionally a paraphase coding of data signals is used here. FIG. 2 demonstrates the self-timed trigger circuit differing from the circuit in FIG. 1 by a presence of trigger's inverse data output 7 connected to the inverse data output 2_6 of the storage unit 2. Thus, a signal formed by trigger's data outputs becomes paraphase (dual-rail) one.

Figure 3:
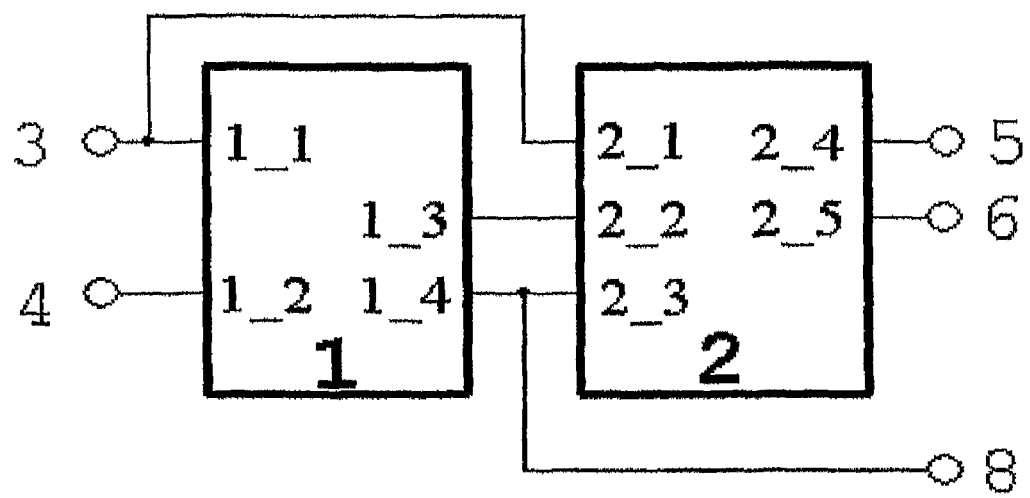
FIG. 3 presents the self-timed trigger circuit differing from the circuit in FIG. 1 by a presence of feedback output.

FIG. 3 presents the self-timed trigger circuit differing from the circuit in FIG. 1 by a presence of feedback output 8 connected to the control signal output 1_4 of the conversion unit 1. Feedback output allows for speeding-up transition of device, which is a source of the trigger's single-rail data input. In this case its transition into opposite phase of operation is permitted just as soon as control output 1_4 of conversion unit 1 switches into appropriate phase, without waiting termination of transition of all other trigger's components.

Figure 4:
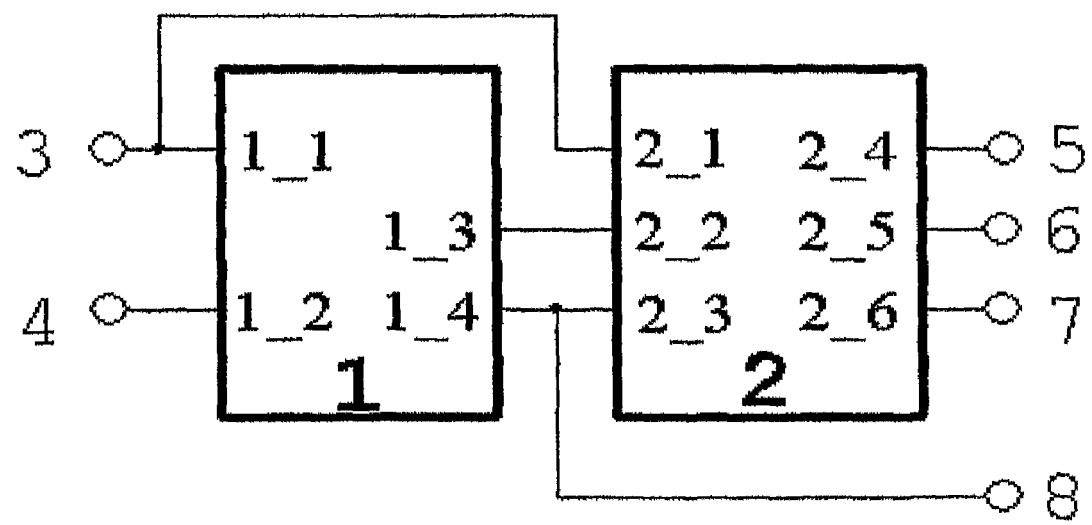
FIG. 4 presents the self-timed trigger circuit differing from the circuit in FIG. 2 by a presence of feedback output.

FIG. 4 presents the self-timed trigger circuit differing from the circuit in FIG. 2 by a presence of feedback output 8 connected to the control signal output 1_4 of the conversion unit 1.

A presence of both paraphase data output (5 and 7) and simultaneously feedback output 8 in the self-timed trigger circuit increases a genericity of its usage, as well as performance of its interaction with an environment.

Figure 5:
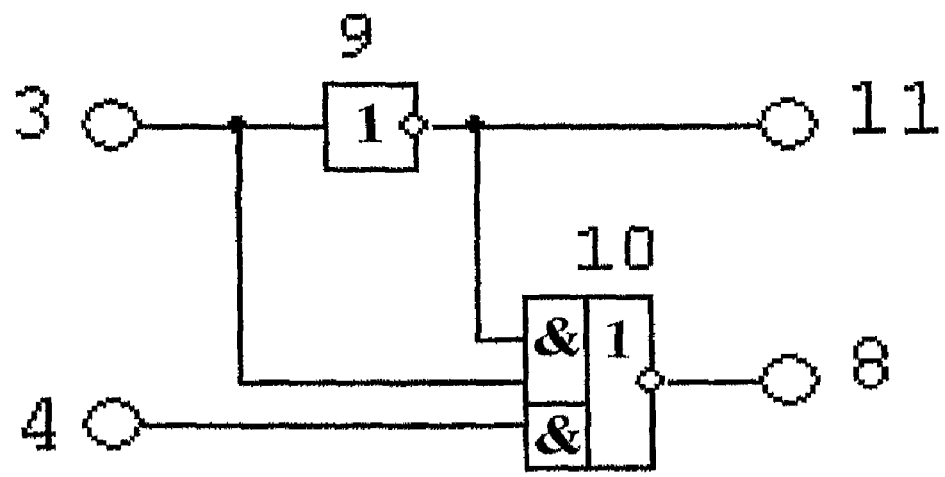
FIG. 5 shows the conversion unit implementation in case when writing down new state into trigger is permitted by low level on the trigger's control input.

FIG. 5 shows the conversion unit implementation in case when writing down new state into trigger is permitted by low level on the trigger's control input.

The circuit contains inverter 9, AND-OR-NOT element 10, single-rail data input 3, control input 4, data output 11 and control output 8, input of inverter 9 is connected to single-rail data input 3 and to second input of first AND input group of AND-OR-NOT element 10, and output of inverter 9 is connected to data output 11 and to first input of first AND input group of AND-OR-NOT element 10, control input 4 is connected to the input of second AND input group of AND-OR-NOT element 10, whose output is connected to control output 8.

Figure 6:
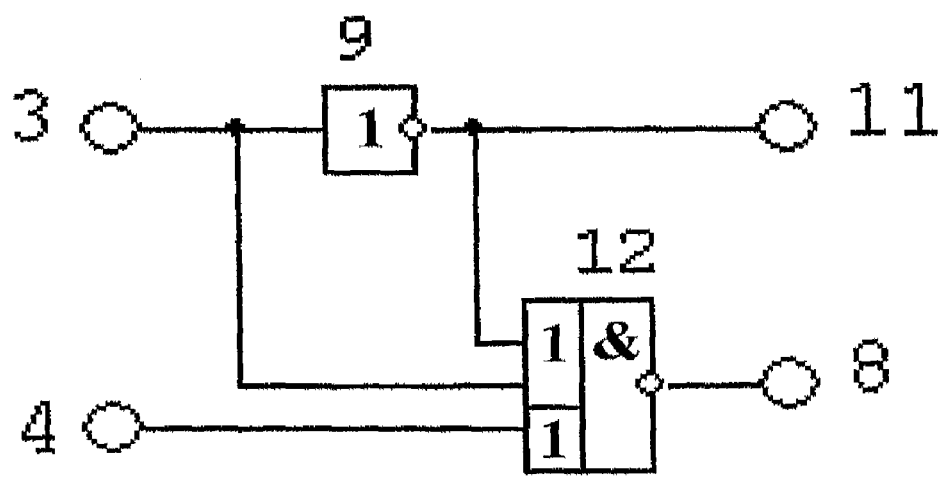
FIG. 6 presents a conversion unit implementation in case when writing new state into trigger is permitted by high level on the trigger's control input.

FIG. 6 presents a conversion unit implementation in case when writing new state into trigger is permitted by high level on the trigger's control input.

The circuit contains inverter 9, OR-AND-NOT element 12, single-rail data input 3, control input 4, data output 11 and control output 8, input of inverter 9 is connected to single-rail data input 3 and to second input of first OR input group of OR-AND-NOT element 12, and output of inverter 9 is connected to data output 11 and to first input of first OR input group of OR-AND-NOT element 12, control input 4 is connected to the input of second OR input group of OR-AND-NOT element 12, whose output is connected to control output 8.

The element 10 in FIG. 5 and element 12 in FIG. 6 at first sight are redundant, because the inputs of their first input group are driven by complementary data signals. But namely this allows for obtaining self-timed behavior of the trigger when transition into the next operation phase is permitted only after termination of the transitions of all circuit components into the current phase. In accordance with definition, circuit is considered as self-timed one if it operates correctly at any limited delays of internal components, i.e. is delay insensitive. In case element 10 in FIG. 5 and element 12 in FIG. 6 do not have such first input group, at some input signal combinations and at arbitrary delays of the circuit elements, inverter 9 would not have time to switch into opposite state during forming new state on the trigger's data outputs, and so at following transition into new work phase it will cause fault trigger transition. Suggested solution provides strict observance of the self-timing principle: indicator in the storage unit switches into work phase only after inverter 9 has switched into the state which is opposite to the value of single-rail data input 3.

Conversion unit inverts control input phase during its transformation. So storage unit should be implemented by a circuit with control input, whose type is opposite to the type of control input of the trigger and conversion unit.

Figure 7:
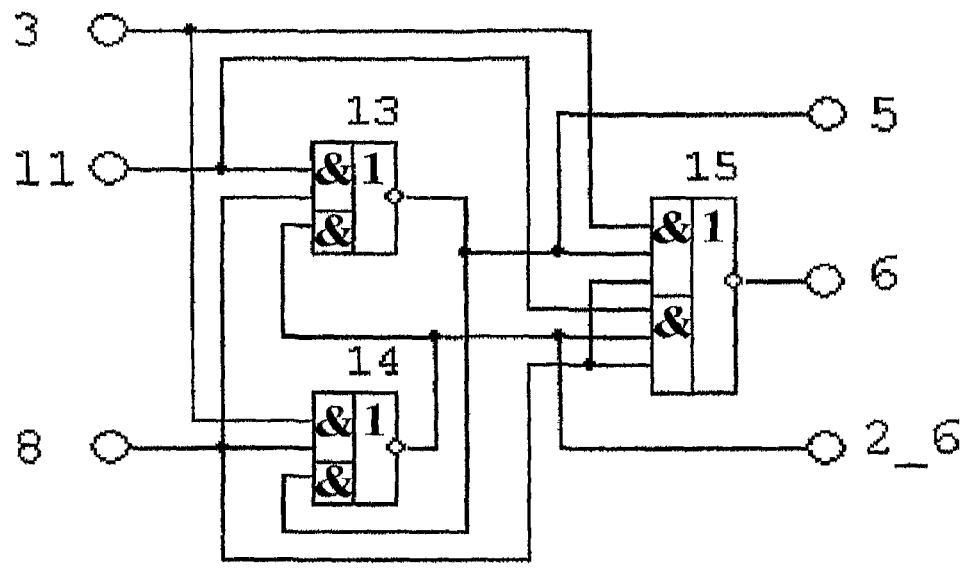
FIG. 7 presents the storage unit implementation of single-state trigger with paraphrase data input for case then input control input with high work level.

FIG. 7 presents the storage unit implementation for case of control input with high work level (a level that permits writing down new state into storage unit) [2].

Circuit in FIG. 7 contains three AND-OR-NOT elements 13-15, paraphase data input 3, 11, control input 8, data 5 and inverse data 2_6 outputs, indication output 6, direct component of paraphase data input 3 is connected to first input of first AND input groups of both second AND-OR-NOT element 14 and third AND-OR-NOT element 15, inverse component of paraphase data input 11 is connected to first inputs of both first AND input group of first AND-OR-NOT element 13 and second AND input group of third AND-OR-NOT element 15, control input 8 is connected to second inputs of first AND input groups of first 13 and second 14 AND-OR-NOT elements and to third inputs of first and second AND input groups of third AND-OR-NOT element 15, output of first AND-OR-NOT element 13 is connected to the input of second AND input group of second AND-OR-NOT element 14, to second input of first AND input group of third AND-OR-NOT element 15 and to the data output 5, output of second AND-OR-NOT element 14 is connected to the input of second AND input group of first AND-OR-NOT element 13, to second input of second AND input group of third AND-OR-NOT element 15 and to the inverse data output 2_6, output of third AND-OR-NOT element 15 is connected to indication output 6.

Figure 8:
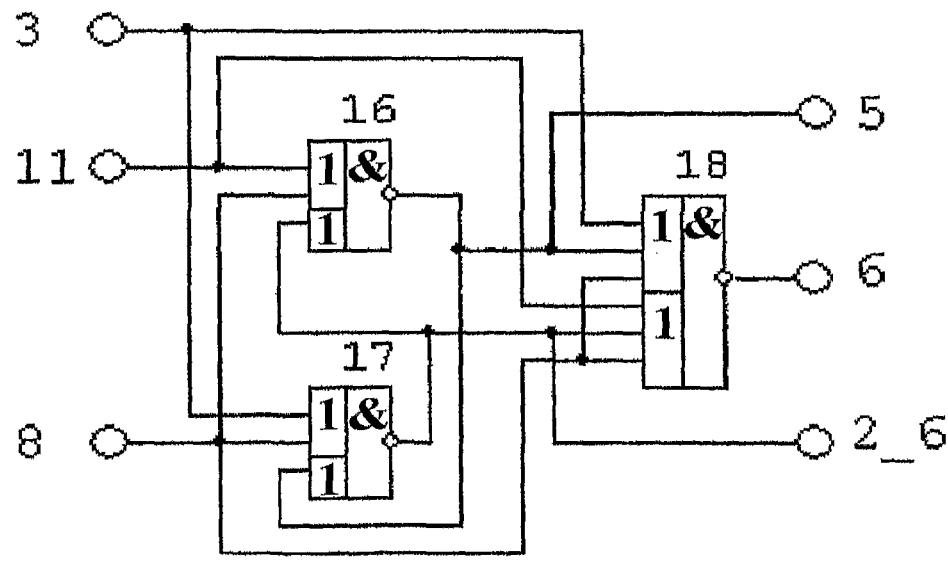

For control input with low work level the storage unit is implemented by a circuit presented in FIG. 8. The elements of referenced circuit are converted to OR-AND-NOT type as shown in FIG. 8 by applying Boolean algebra rules. Circuit contains three OR-AND-NOT elements 16-18, paraphase data input 3, 11, control input 8, data 5 and inverse data 2_6 outputs, indication output 6, direct component of paraphase data input 3 is connected to first input of first OR input groups of both second OR-AND-NOT element 17 and third OR-AND-NOT element 18, inverse component of paraphase data input 11 is connected to first inputs of both first OR input group of first OR-AND-NOT element 16 and second OR input group of third OR-AND-NOT element 18, control input 8 is connected to second inputs of first OR input groups of first 16 and second 17 OR-AND-NOT elements and to third inputs of first and second OR input groups of third OR-AND-NOT element 18, output of first OR-AND-NOT element 16 is connected to the input of second OR input group of second OR-AND-NOT element 17, to second input of first OR input group of third OR-AND-NOT element 18 and to the data output 5, output of second OR-AND-NOT element 17 is connected to the input of second OR input group of first OR-AND-NOT element 16, to second input of second OR input group of third OR-AND-NOT element 18 and to the inverse data output 2_6, output of third OR-AND-NOT element 18 is connected to indication output 6.

Figure 9:
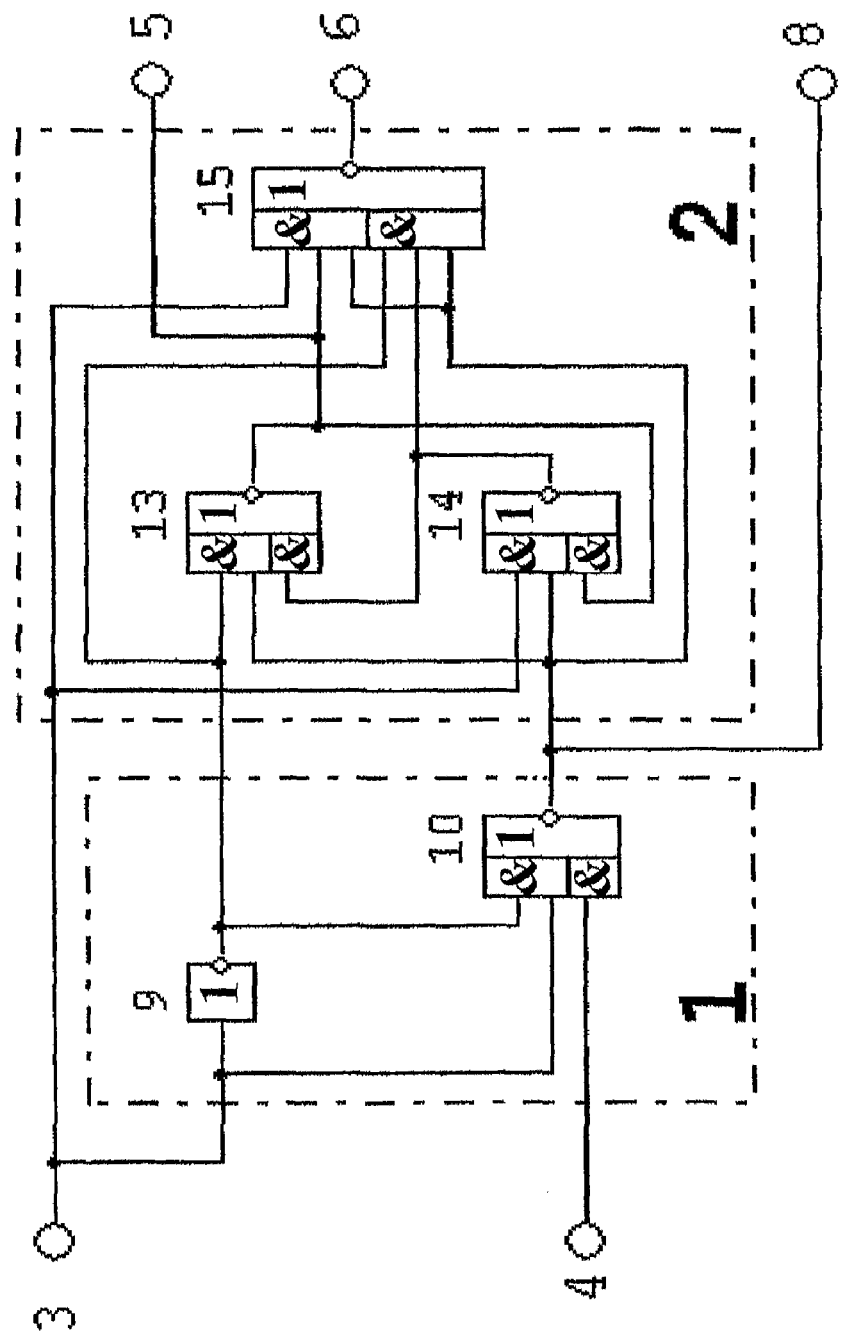
FIG. 9 presents a simplest case, single-state trigger with single-rail data input.

Thus, in the simplest case, single-state self-timed trigger circuit with single-rail data input is implemented by a circuit shown in FIG. 9. It contains conversion unit 1 consisting of inverter 9 and AND-OR-NOT element 10, storage unit 2 including bistable cell on AND-OR-NOT elements 13-14 and indicator AND-OR-NOT 15, single-rail data input 3, control input 4, data 5 and inverse data 2_6 outputs, indication output 6 and feedback output 8.

Described above trigger does not have preset "1" (further "set") and preset "0" (further "reset") inputs, that is a disadvantage in some practical cases. However suggested variants of the storage unit and trigger are easily transformed into circuit with presets.

Figure 10:
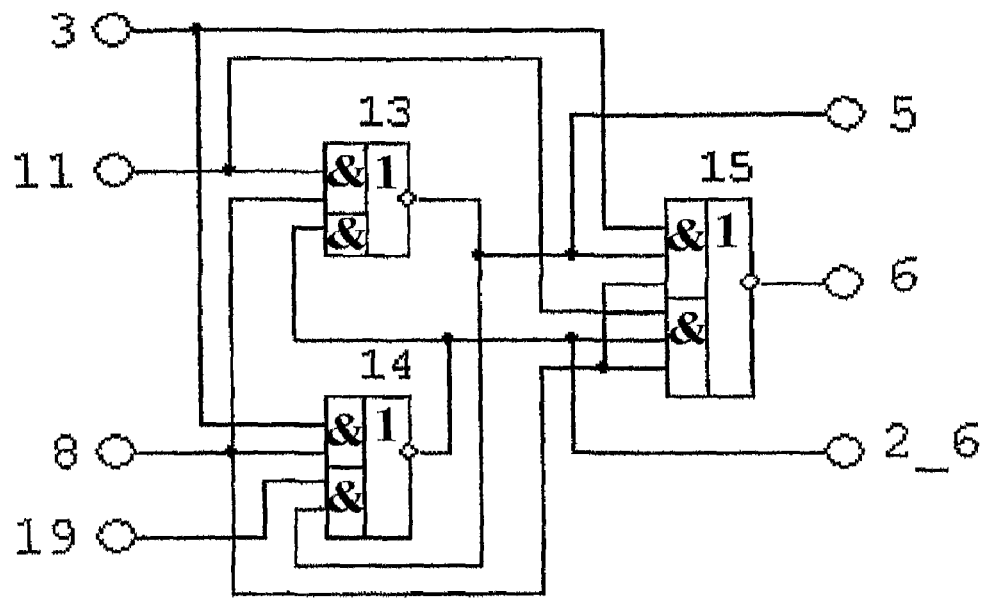
FIG. 10 presents an implementation of the storage unit for case of control input with high work level that has an additional reset input.

FIG. 10 presents an implementation of the storage unit for case of control input with high work level that has an additional reset input 19. It differs from the circuit in FIG. 7 by that a second input connected to reset input 19 is added to second AND input group of second AND-OR-NOT element 14.

Circuit operates as follows. Writing down new state from the paraphase data input 3, 11 is provided by applying high level onto control input 8 from the control output of conversion unit. If input 3 is in high level, AND-OR-NOT element 14 switches into low-level state (logical "0"), and AND-OR-NOT element 13 switches into high-level state (logical "1"). At that indication output 6 switches into state "0". At low level on control input 8 bistable cell on elements 13 and 14 locks its inputs storing a state of its outputs. At that indication output 6 switches into state "1". Element AND-OR-NOT 15 performs a function of termination indicator for transitions in all trigger's components. A value "0" on output of element 15 confirms termination of trigger's transition into work phase, and value "1" confirms termination of trigger's transition into spacer, that is a phase of storing trigger's state. Thereby self-timing mode of its operation is provided.

Resetting is realized by applying low level onto control input 8 and onto reset input 19. As a result output of AND-OR-NOT element 14 forming inverse data output 2_6 of the storage unit switches into "1" state, and AND-OR-NOT element 13 forming trigger's data output 5 then switches into "0" state thereby finishing reset procedure.

Figure 11:
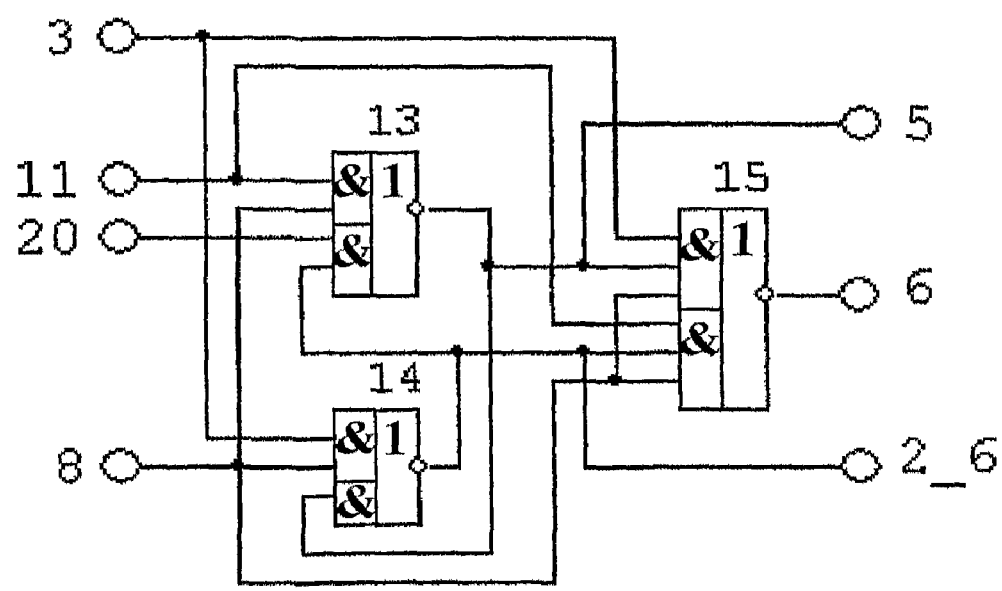
FIG. 11 presents an implementation of the storage unit for case of control input with high work level that has an additional set input.

FIG. 11 presents an implementation of the storage unit for case of control input with high work level that has an additional set input 20. It differs from the circuit in FIG. 7 by that a second input connected to set input 20 is added to second AND input group of first AND-OR-NOT element 13. Setting is realized by applying low level onto control input 8 and onto set input 20. As a result output of AND-OR-NOT element 13 forming trigger's data output 5 switches into "1" state, and AND-OR-NOT element 14 forming trigger's inverse data output 2_6 then switches into "0" state.

Figure 12:
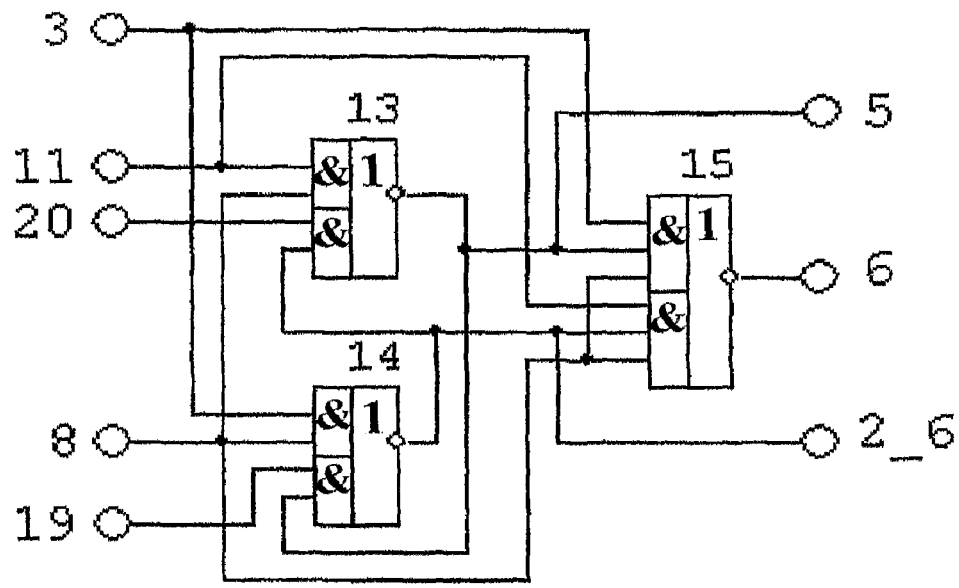
FIG. 12 shows an implementation of the storage unit for case of control input with high work level, that has an additional reset input and set input.

FIG. 12 shows an implementation of the storage unit for case of control input with high work level, that has an additional reset input 19 and set input 20. It differs from the circuit in FIG. 10 by that second input connected to set input 20 is added to second AND input group of first AND-OR-NOT element 13. Presets of "0" and "1" are realized as described above. Simultaneous setting low level on inputs 19 and 20 is prohibited.

The storage unit in case, when writing down new state into it is permitted by a low level on control input, is implemented similarly.

Figure 13:
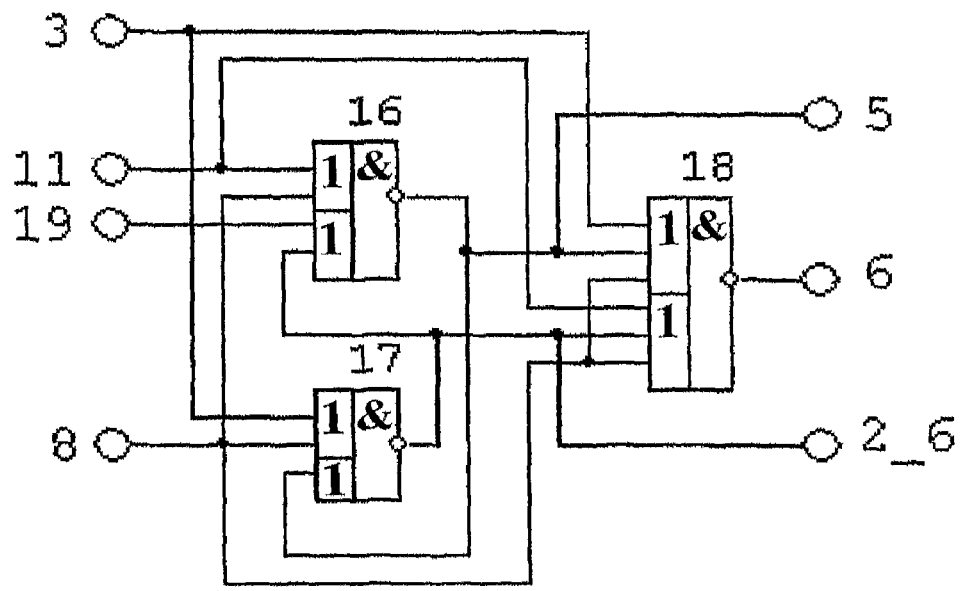
FIG. 13 presents an implementation of the storage unit for case of control input with low work level that has an additional reset input.

FIG. 13 presents an implementation of the storage unit for case of control input with low work level that has an additional reset input 19. It differs from the circuit in FIG. 8 by that second input connected to reset input 19 is added to second OR input group of first OR-AND-NOT element 16.

Circuit operates as follows. Writing down new state from the paraphase data input 3, 11 is provided by applying low level onto control input 8. If input 3 is in low level, OR-AND-NOT element 17 switches into logical "1", and OR-AND-NOT element 16 switches into logical "0". At that indication output 6 switches into state "1". At high level on control input 8 bistable cell on elements 16 and 17 locks its inputs and stores a state of its outputs. At that indication output 6 switches into state "0".

Resetting is realized by applying high level onto control input 8 and onto reset input 19. As a result output of OR-AND-NOT element 16 forming trigger's data output 5 switches into "0" state, and OR-AND-NOT element 17 forming inverse data output 2_6 of the storage unit then switches into "1" state thereby finishing reset procedure.

Figure 14:
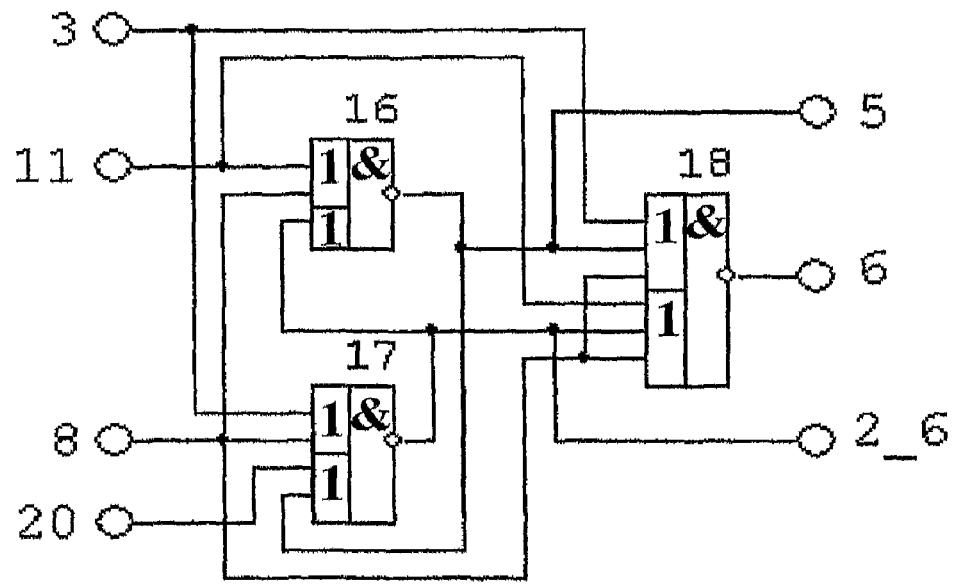
FIG. 14 presents an implementation of the storage unit for case of control input with low work level, that has an additional set input.

FIG. 14 presents an implementation of the storage unit for case of control input with low work level, that has an additional set input 20. It differs from the circuit in FIG. 8 by that second input connected to set input 20 is added to second OR input group of second OR-AND-NOT element 17. Setting is realized by applying high level onto control input 8 and onto set input 20. As a result output of OR-AND-NOT element 17 forming inverse data output 2_6 of the storage unit switches into "0" state, and OR-AND-NOT element 16, forming trigger's data output 5, then switches into "1" state.

Figure 15:
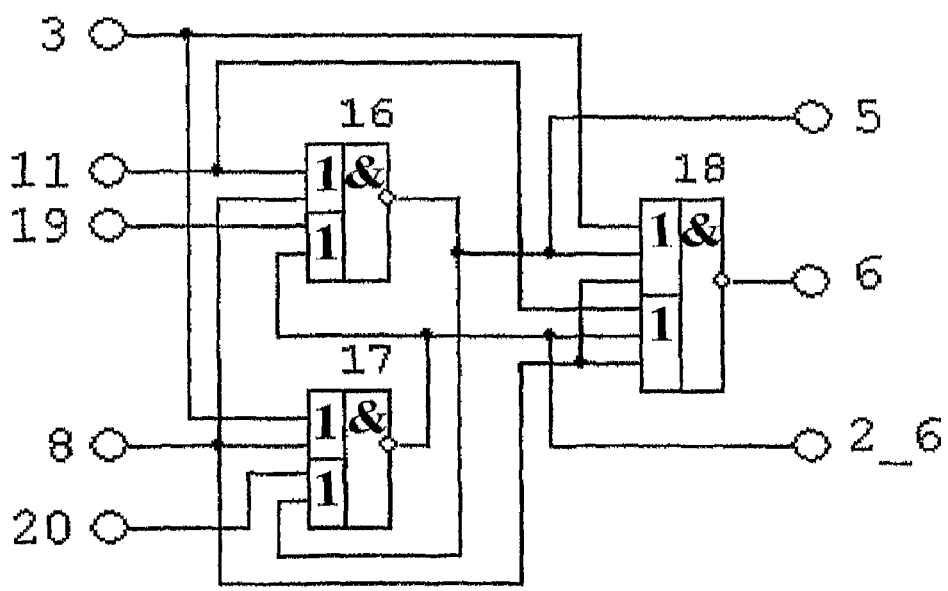
FIG. 15 shows an implementation of the storage unit for case of control input with low work level, that has an additional reset input and set input.

FIG. 15 shows an implementation of the storage unit for case of control input with low work level, that has an additional reset input 19 and set input 20. It differs from the circuit in FIG. 13 by that second input connected to set input 20 is added to second OR input group of second OR-AND-NOT element 17. Presets of "0" and "1" are realized as described above. Simultaneous applying high level onto inputs 19 and 20 is prohibited.

Presetting "0" and "1" in described above variants may be both synchronous, and self-timed. In case of synchronous presetting, that traditionally is used for initial circuit presetting after turn on supply voltage, it is supposed circuit shall be set at required state after some determined time. At that preset signal duration is chosen liberal which is sufficient for successful finishing preset procedure in circuit. In case of self-timed preset an additional circuit of indication of preset termination is used. At that appropriate output is controlled, which switches last during preset. In both cases indicator stores spacer state as control input is in spacer.

Described above implementations of the storage unit are single-stage one. They cannot be used for building, for example, shift register on their basis. In order to one can use suggested trigger as a bit of shift register, storage unit should be realized on base of two sequential bistable cells with counterphase control. At that outputs of both bistable cells should be indicated. Conversion unit does not change and corresponds to the FIG. 5 or FIG. 6 depending on work state of the control input.

Figure 16:
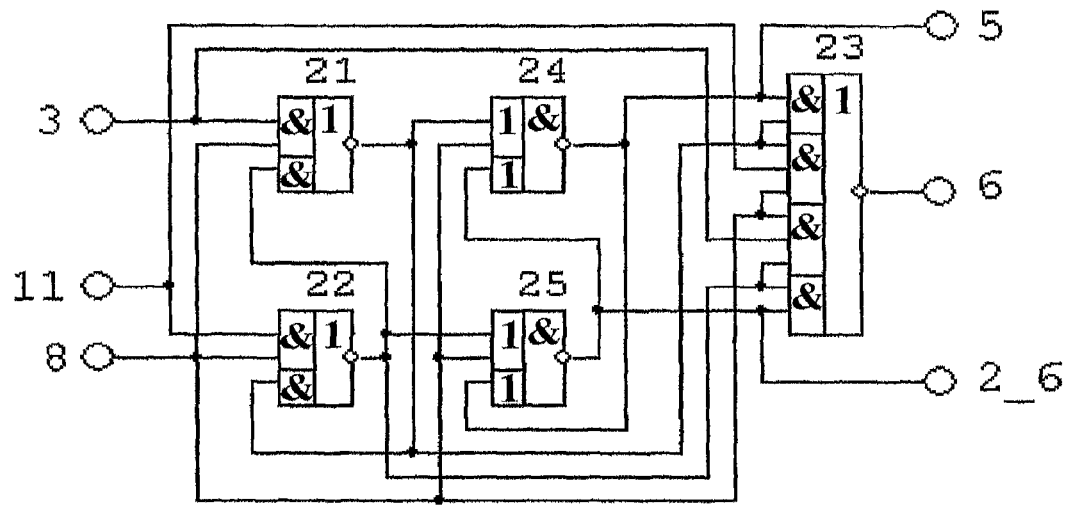
FIG. 16 presents the storage unit of two-stage trigger for case, when writing down new state is performed at high level on its control input.

FIG. 16 presents storage unit of two-stage self-timed trigger circuit for case, when writing down new state is performed at high level on its control input. It is a result of applying Boolean algebra rules to the two-stage trigger circuit [4].

Circuit contains three AND-OR-NOT elements 21-23, two OR-AND-NOT elements 24-25, direct 3 and inverse 11 components of paraphase data input, control input 8, data output 5, inverse data output 2_6 and indication output 6, direct component of paraphase data input 3 is connected to first input of first AND input group of AND-OR-NOT element 21 and to second input of third AND input group of AND-OR-NOT element 23, inverse component of paraphase data input 11 is connected to first input of first AND input group of AND-OR-NOT element 22 and to second input of second AND input group of AND-OR-NOT element 23, control input 8 is connected to second inputs of first AND input groups of AND-OR-NOT elements 21 and 22 and of first OR input groups of OR-AND-NOT elements 24 and 25, to third input of second AND input group and to first input of third AND input group of AND-OR-NOT element 23, output of AND-OR-NOT element 21 is connected to second input of first AND input group and to first input of second AND input group of AND-OR-NOT element 23, to the input of second AND input group of AND-OR-NOT element 22 and to first input of first OR input group of OR-AND-NOT element 24, whose output is connected to the input of second OR input group of OR-AND-NOT element 25, to first input of first AND input group of AND-OR-NOT element 23 and to data output 5 of the storage unit, output of AND-OR-NOT element 22 is connected to third input of third AND input group and to first input of fourth AND input group of AND-OR-NOT element 23, to input of second AND input group of AND-OR-NOT element 21 and to first input of first OR input group of OR-AND-NOT element 25, whose output is connected to the input of second OR input group of OR-AND-NOT element 24, to second input of fourth AND input group of AND-OR-NOT element 23 and to inverse data output of the storage unit 2_6, output of AND-OR-NOT element 23 is connected to indication output 6.

Circuit operates as follows. Writing new state from paraphase data input 3, 11 into bistable cell formed by elements 21 and 22 is provided by applying high level on control input 8. At that inputs of this bistable cell are unlocked for writing. If high level signal is on the direct component 3 of data input, then AND-OR-NOT element 21 switches into state "0", and AND-OR-NOT element 22 switches into state "1". Then indication output 6 switches into state "0", and bistable cell on OR-AND-NOT elements 24 and 25 stores its state. At low level on control input 8 bistable cell on elements 21 and 22 keeps its output state. At that second bistable cell on OR-AND-NOT elements 24 and 25 unlocks its inputs and state of first bistable cell is written into the second bistable cell. A state of storage unit outputs 5 and 2_6 is updated, and indication output switches into state "1". Element AND-OR-NOT 23 performs an indicator function fixing termination of transitions in all components and in all inputs of the two-stage trigger. Value "0" on output of element 23 confirms termination of switching trigger into work phase, when state of the paraphase data input 3, 11 is fixed on outputs of first bistable cell on elements 21 and 22. Vice versa value "1" on output of element 23 confirms termination of switching storage unit into spacer, when first bistable cell keeps its state and second bistable cell on elements 24 and 25 updates its own state. Thereby self-timing principle of operation is provided.

Figure 17:
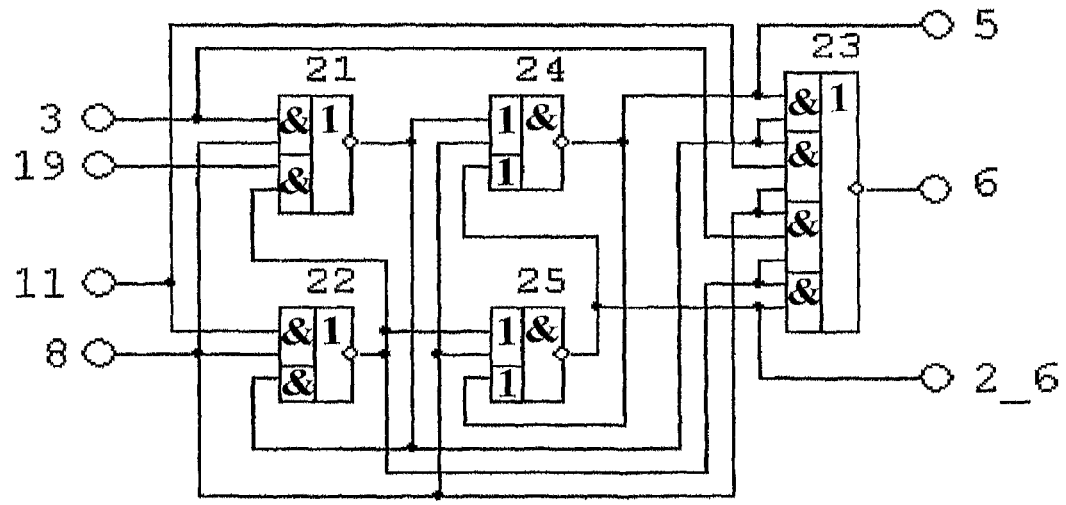
FIG. 17 presents the storage unit of two-stage self-timed trigger circuit with reset input and high work level of control input.

FIG. 17 presents the storage unit of two-stage self-timed trigger circuit with reset input 19 and high work level of control input 8. This circuit differs from FIG. 16 by that second input connected to the reset input 19 is added to second AND input group of AND-OR-NOT element 21. Resetting is realized by applying low level onto control input 8 and onto reset input 19. As a result output of AND-OR-NOT element 21 switches into state "1", AND-OR-NOT element 22 switches into state "0", OR-AND-NOT element 25 forming inverse data output 2_6 of the storage unit, switches into "1" state, and OR-AND-NOT element 24 forming data output 5 of the storage unit then switches into "0" state thereby finishing reset procedure.

Figure 18:
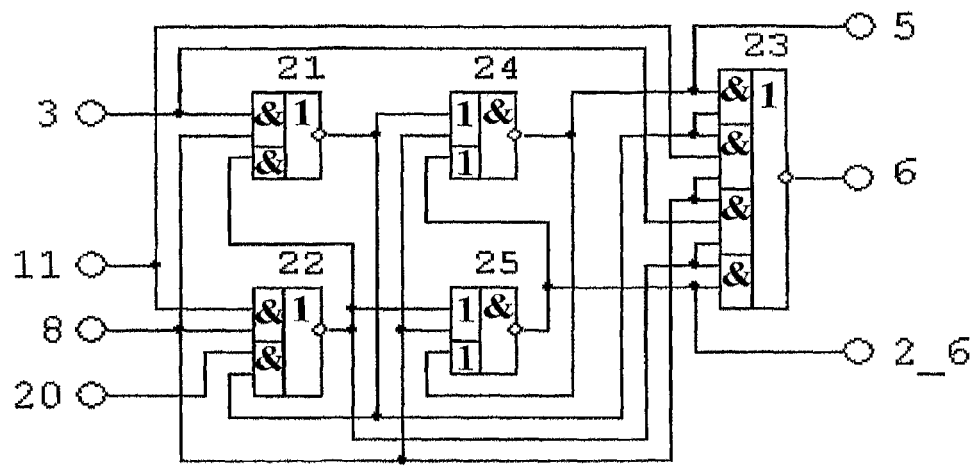
FIG. 18 presents the storage unit of two-stage self-timed trigger circuit with set input and high work level of control input.

FIG. 18 presents the storage unit of two-stage self-timed trigger circuit with set input 20 and high work level of control input 8. This circuit differs from FIG. 16 by that second input connected to the set input 20 is added to second AND input group of AND-OR-NOT element 22. Presetting is realized by applying low level onto control input 8 and onto set input 20. As a result output of AND-OR-NOT element 22 switches into state "1", AND-OR-NOT element 21 switches into state "0", OR-AND-NOT element 24 forming data output 5 of the storage unit switches into "1" state, and OR-AND-NOT element 25 forming inverse data output 2_6 of the storage unit then switches into "0" state thereby finishing preset procedure.

Figure 19:
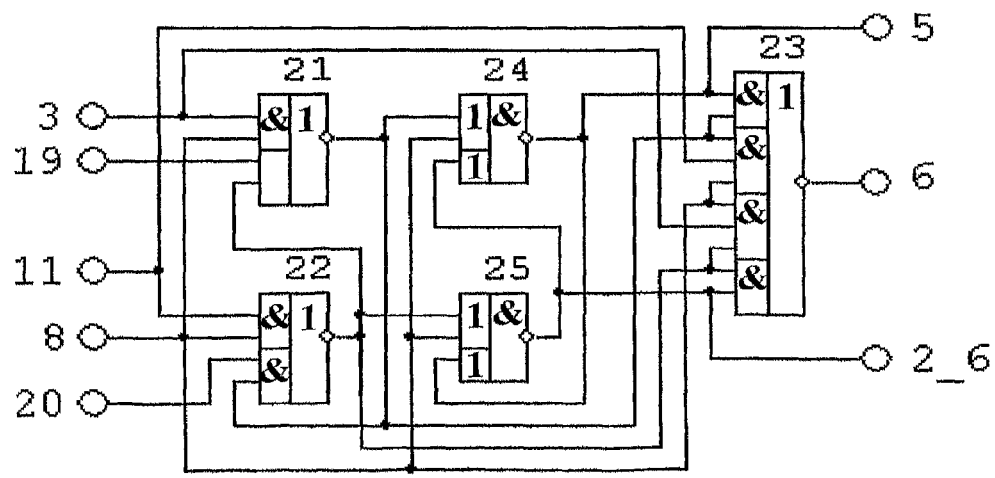
FIG. 19 shows the storage unit of two-stage self-timed trigger circuit with reset input and set input, and high work level of control input.

FIG. 19 shows the storage unit of two-stage self-timed trigger circuit with reset input 19 and set input 20, and high work level of control input 8. This circuit differs from FIG. 17 by that second input connected to the set input 20 is added to second AND input group of AND-OR-NOT element 22. Preset of "0" and "1" is realized as described above. Simultaneous setting low level on inputs 19 and 20 is prohibited.

Described variants of implementation of the storage unit of two-stage trigger with reset and/or set inputs and high work level of control input are characterized by that preset is not self-timed. During preset procedure transitions of the outputs of both bistable cells can cause hazards on indication output 6. In most practical cases this is not essential, because trigger preset is used at once when turning on power supply of device containing trigger. However such solution is inadmissible for dynamical presetting "0" or "1" on trigger outputs in self-timed devices. One of conditions of belonging any unit to the strictly self-timed circuits class is an absence of any hazards, any "bounce" on inputs of elements.

Figure 20:
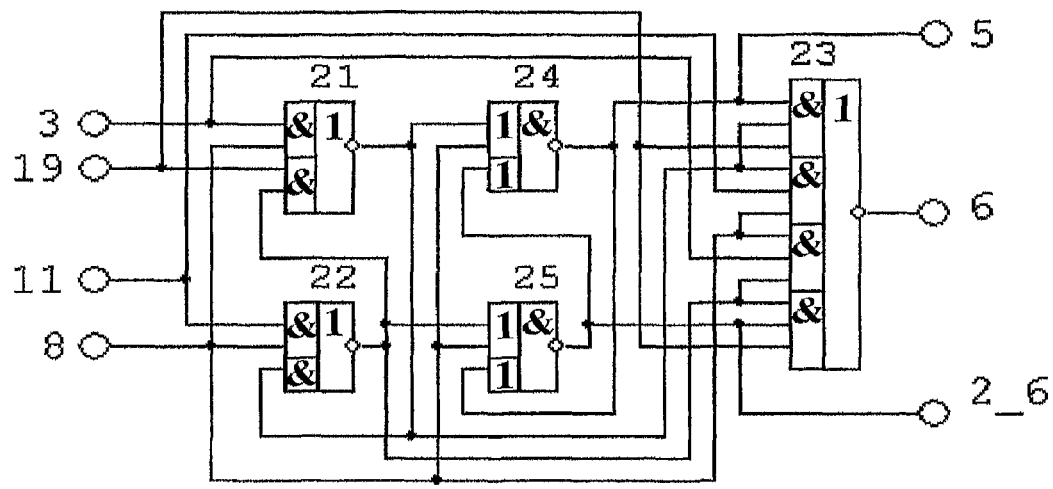
FIG. 20 shows the storage unit of two-stage self-timed trigger circuit with reset input and high work level of control input, which satisfies strictly self-timed requirements.

FIG. 20 shows the storage unit of two-stage self-timed trigger circuit with reset input 19 and high work level of control input 8, which satisfies strictly self-timed requirements. This variant of storage unit differs from circuit in FIG. 17 by that third inputs connected to the reset input 19 are added to first and fourth AND input groups of AND-OR-NOT element 23. Resetting is performed as described above. But now output of indication element AND-OR-NOT 23 does not change during resetting, as all its input groups are locked by low level on control input 8 and on reset input. Indication of reset termination is realized by additional logic indicating transition of the data output 5 into state "0".

Figure 21:
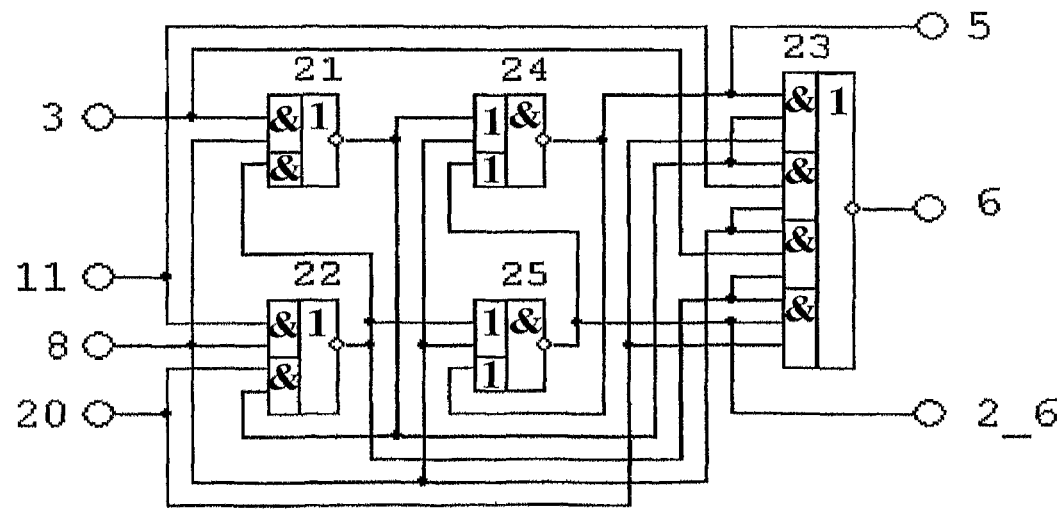
FIG. 21 demonstrates the storage unit of two-stage self-timed trigger circuit with set input and high work level of control input, which satisfies strictly self-timed requirements.

FIG. 21 demonstrates the storage unit of two-stage self-timed trigger circuit with set input 20 and high work level of control input 8, which satisfies strictly self-timed requirements. This variant of storage unit differs from circuit in FIG. 18 by that third inputs connected to the set input 20 are added to first and fourth AND input groups of AND-OR-NOT element 23. Setting is performed as described above. But now output of indication element AND-OR-NOT 23 does not change during setting, as all its input groups are locked by low level on control input 8 and on set input. Indication of set termination is realized by additional logic indicating transition of the inverse data output 2_6 of the storage unit into state "0".

Figure 22:
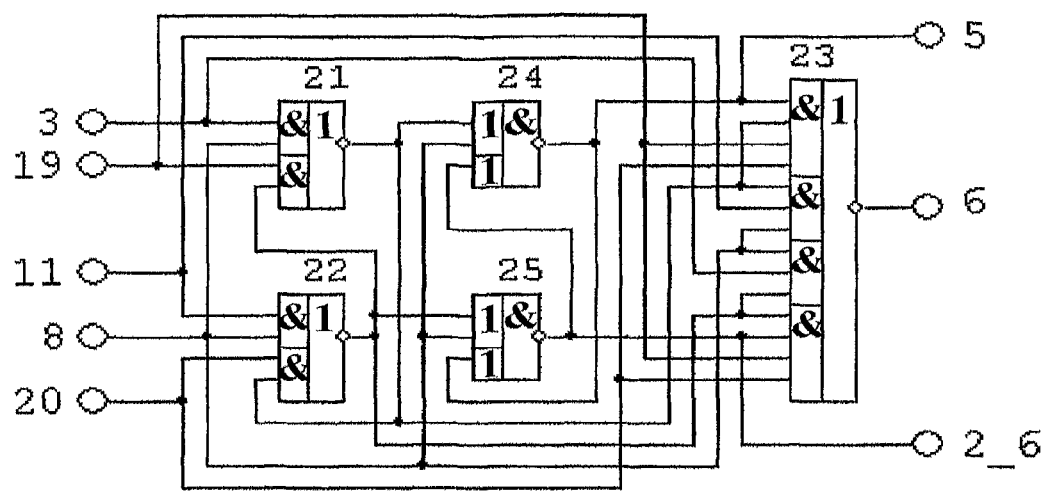
FIG. 22 presents the storage unit of two-stage trigger with reset and set inputs and with high work level of control input, which satisfies strictly self-timed requirements.

FIG. 22 presents the storage unit of two-stage trigger with reset 19 and set 20 inputs and with high work level of control input 8, which satisfies strictly self-timed requirements. This variant of storage unit differs from circuit in FIG. 20 by that fourth inputs connected to the set input 20 are added to first and fourth AND input groups of AND-OR-NOT element 23. Presetting "0" and "1" is performed as described above. But now output of indication element AND-OR-NOT 23 does not change during presetting, as all its input groups are locked by low level on control input 8 and on one of preset inputs. Indication of preset termination is realized by additional logic indicating transition of the data output 5 into state "0" at resetting, or transition of the inverse data output 2_6 of the storage unit into state "0" at setting.

Simultaneous applying low level onto inputs 19 and 20 is prohibited.

Figure 23:
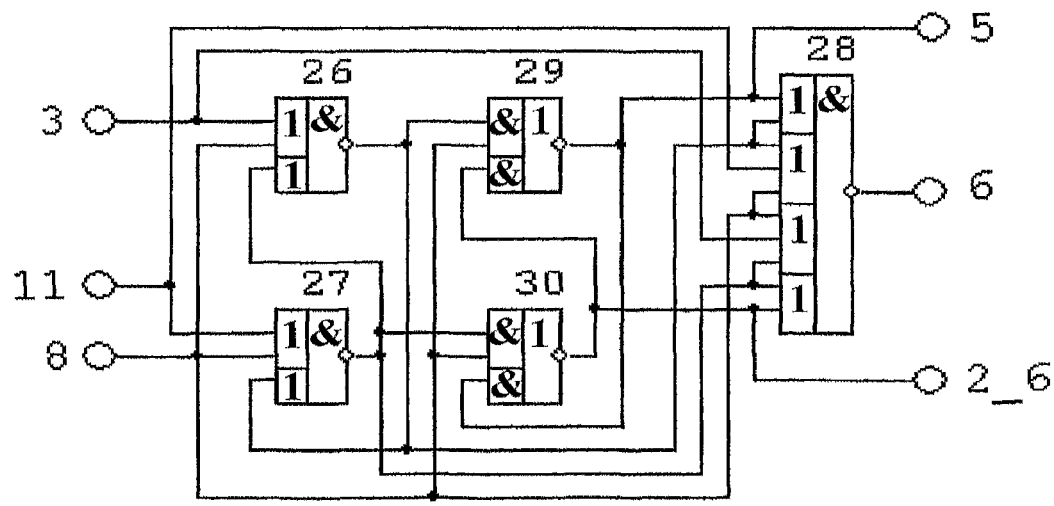
FIG. 23 presents the storage unit of two-stage self-timed trigger circuit for case, when writing down new state is performed at low level on its control input.

FIG. 23 presents the storage unit of two-stage self-timed trigger circuit for case, when writing down new state is performed at low level on its control input. It is a result of applying Boolean algebra rules to the two-stage trigger circuit [5].

Circuit contains three OR-AND-NOT elements 26-28, two AND-OR-NOT elements 29-30, direct 3 and inverse 11 components of paraphase data input, control input 8, data output 5, inverse data output 2_6 and indication output 6, direct component of paraphase data input 3 is connected to first input of first OR input group of OR-AND-NOT element 26 and to second input of third OR input group of OR-AND-NOT element 28, inverse component of paraphase data input 11 is connected to first input of first OR input group of OR-AND-NOT element 27 and to second input of second OR input group of OR-AND-NOT element 28, control input 8 is connected to second inputs of first OR input groups of OR-AND-NOT elements 26 and 27 and of first AND input groups of AND-OR-NOT elements 29 and 30, to third input of second OR input group and to first input of third OR input group of OR-AND-NOT element 28, output of OR-AND-NOT element 26 is connected to second input of first OR input group and to first input of second OR input group of OR-AND-NOT element 28, to the input of second OR input group of OR-AND-NOT element 27 and to first input of first AND input group of AND-OR-NOT element 29, whose output is connected to the input of second AND input group of AND-OR-NOT element 30, to first input of first OR input group of OR-AND-NOT element 28 and to data output 5 of the storage unit, output of OR-AND-NOT element 27 is connected to third input of third OR input group and to first input of fourth OR input group of OR-AND-NOT element 28, to the input of second OR input group of OR-AND-NOT element 26 and to first input of first AND input group of AND-OR-NOT element 30, whose output is connected to the input of second AND input group of AND-OR-NOT element 29, to second input of fourth OR input group of OR-AND-NOT element 28 and to the inverse data output of the storage unit 2_6, output of OR-AND-NOT element 28 is connected to indication output 6.

Circuit operates as follows. Writing down new state from paraphase data input 3, 11 into bistable cell formed by elements 26 and 27 is provided by applying low level on control input 8. At that inputs of this bistable cell become unlocked for writing. If low level is on the direct component 3 of data input, then OR-AND-NOT element 26 switches into state "1", and OR-AND-NOT element 27 switches into state "0". Then indication output 6 switches into state "1", and bistable cell on AND-OR-NOT elements 29 and 30 stores its state. At high level on control input 8 bistable cell on elements 26 and 27 locks its inputs and keeps its output state. At that second bistable cell on AND-OR-NOT elements 29 and 30 unlocks its inputs, and state of first bistable cell is wrote into the second bistable cell. A state of storage unit's outputs 5 and 2_6 is updated, and indication output 6 switches into state "0". Element OR-AND-NOT 28 performs as indicator fixing termination of transitions of all components and of all inputs of the two-stage trigger. Value "1" on output of element 28 confirms termination of switching trigger into work phase, when state of the paraphase data input 3, 11 is fixed on the outputs of first bistable cell on elements 26 and 27. Vice versa value "0" on output of element 28 confirms termination of switching storage unit into spacer, when first bistable cell keeps its state and second bistable cell on element 29 and 30 updates its own state. Thereby self-timing principle of operation is provided.

Figure 24:
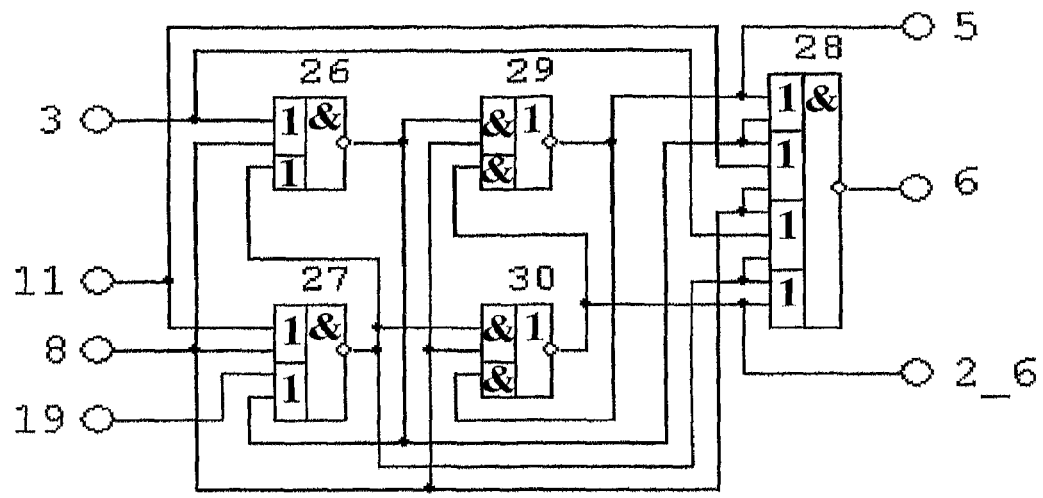
FIG. 24 presents the storage unit of two-stage self-timed trigger circuit with reset input and low work level of control input.

FIG. 24 presents the storage unit of two-stage self-timed trigger circuit with reset input 19 and low work level of control input 8. This circuit differs from FIG. 23 by that second input connected to the reset input 19 is added to second OR input group of OR-AND-NOT element 27. Resetting is realized by applying high level onto control input 8 and onto reset input 19. As a result output of OR-AND-NOT element 27 switches into state "0", OR-AND-NOT element 26 switches into state "1", AND-OR-NOT element 29 forming data output 5 of the storage unit switches into "0" state, and AND-OR-NOT element 30 forming inverse data output 2_6 of the storage unit then switches into "1" state thereby finishing reset procedure.

Figure 25:
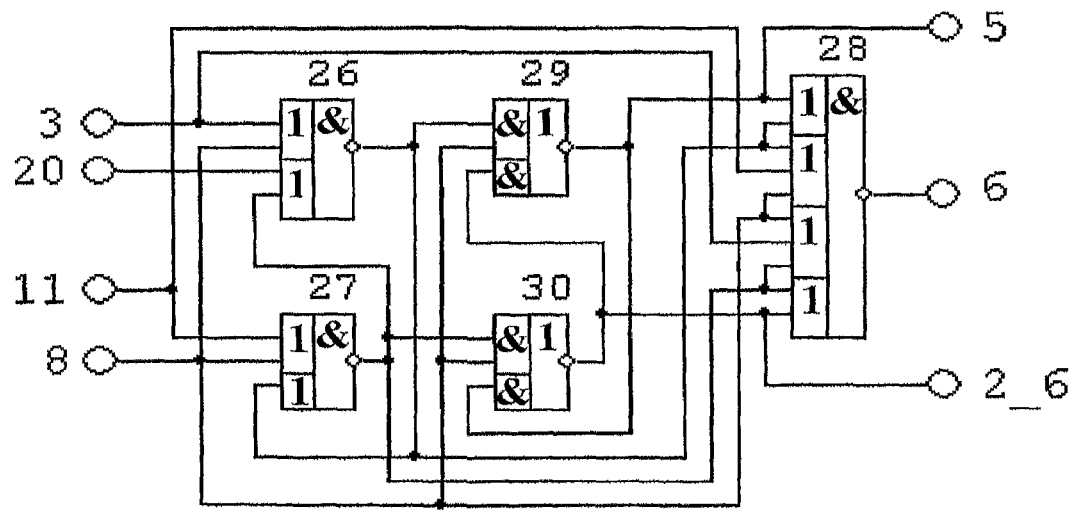
FIG. 25 presents the storage unit of two-stage self-timed trigger circuit with set input and low work level of control input.

FIG. 25 presents the storage unit of two-stage self-timed trigger circuit with set input 20 and low work level of control input 8. This circuit differs from FIG. 23 by that second input connected to the set input 20 is added to second OR input group of OR-AND-NOT element 26. Setting is realized by applying high level onto control input 8 and onto set input 20. As a result output of OR-AND-NOT element 26 switches into state "0", OR-AND-NOT element 27 switches into state "1", AND-OR-NOT element 30 forming inverse data output 2_6 of the storage unit switches into "0" state, and AND-OR-NOT element 29 forming data output 5 of the storage unit then switches into "1" state thereby finishing preset procedure.

Figure 26:
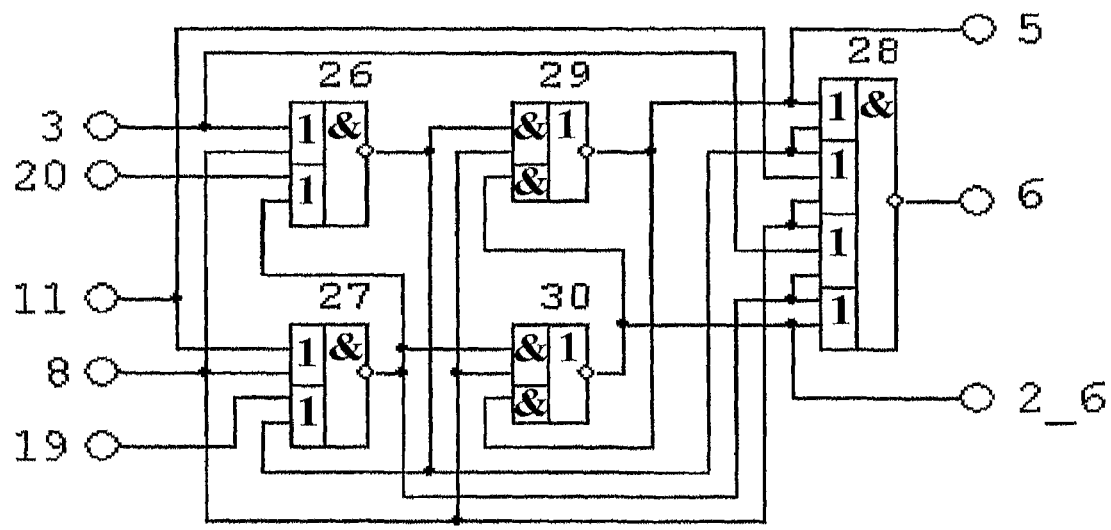
FIG. 26 shows the storage unit of two-stage self-timed trigger circuit with reset input and set input, and low work level of control input.

FIG. 26 shows the storage unit of two-stage self-timed trigger circuit with reset input 19 and set input 20, and low work level of control input 8. This circuit differs from FIG. 24 by that second input connected to the set input 20 is added to second OR input group of OR-AND-NOT element 26. Preset of "0" and "1" is realized as described above. Simultaneous applying high level onto inputs 19 and 20 is prohibited.

Described variants of implementation of the storage unit of two-stage trigger with reset and/or set input and low work level of control input are characterized by that preset is not self-timed. During preset procedure transitions of the outputs of both bistable cells can cause hazards on indication output 6. In most practical cases this is not essential, because trigger preset is used at once when turning on power supply of device containing trigger. However such solution is inadmissible for dynamical presetting "0" or "1" on trigger outputs in self-timed devices.

Figure 27:
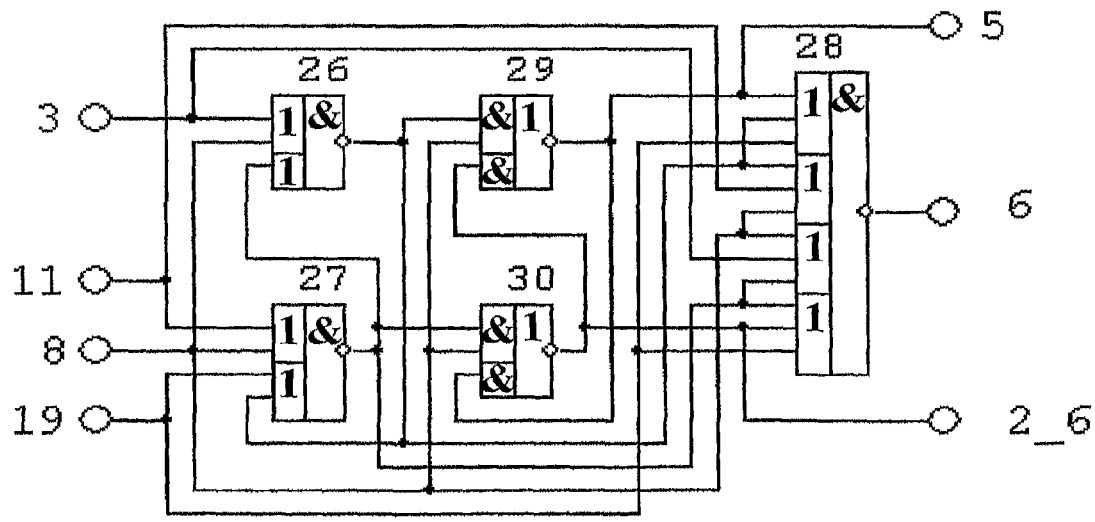
FIG. 27 demonstrates the storage unit of two-stage self-timed trigger circuit with reset input and low work level of control input, which satisfies strictly self-timed requirements.

FIG. 27 demonstrates the storage unit of two-stage self-timed trigger circuit with reset input 19 and low work level of control input 8, which satisfies strictly self-timed requirements. This variant of storage unit differs from circuit in FIG. 24 by that third inputs connected to the reset input 19 are added to the first and fourth OR input groups of OR-AND-NOT element 28. Resetting is performed as described above. But now output of indication element OR-AND-NOT 28 does not change during resetting, as all its input groups are locked by high level on control input 8 and on reset input. Indication of reset termination is realized by additional logic indicating transition of the inverse data output 2_6 into state "1".

Figure 28:
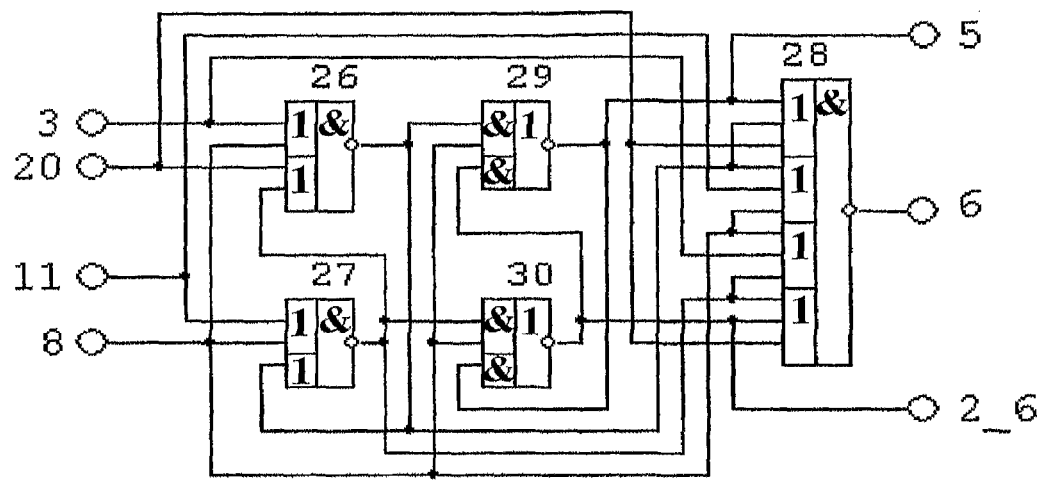
FIG. 28 presents the storage unit of two-stage trigger with set input and low work level of control input, which satisfies strictly self-timed requirements.

FIG. 28 presents the storage unit of two-stage trigger with set input 20 and low work level of control input 8, which satisfies strictly self-timed requirements. This variant of storage unit differs from circuit in FIG. 25 by that third inputs connected to the set input 20 are added to first and fourth OR input groups of OR-AND-NOT element 28. Setting is performed as described above. But now output of indication element OR-AND-NOT 28 does not change during setting, as all its input groups are locked by high level on control input 8 and on set input. Indication of set termination is realized by additional logic indicating transition of the data output 5 into state "1".

Figure 29:
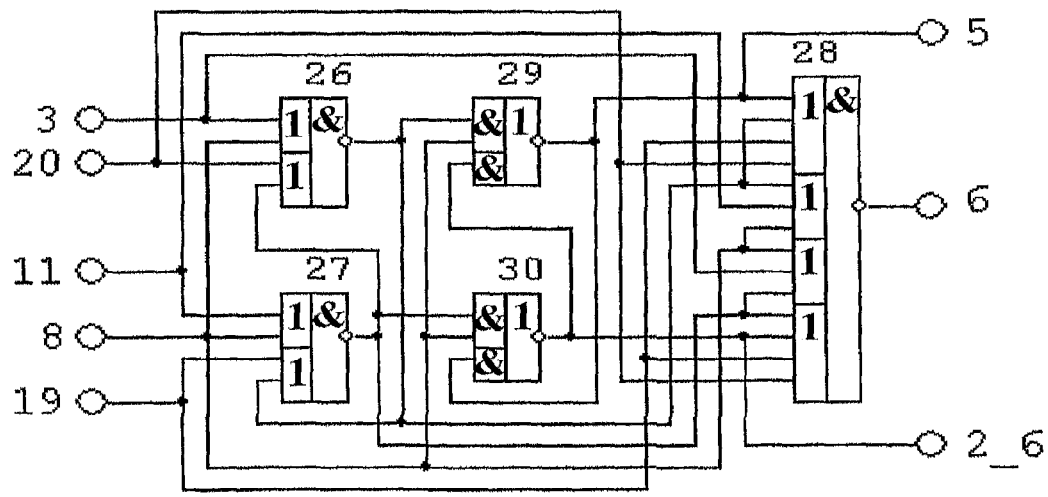
FIG. 29 presents the storage unit of two-stage self-timed trigger circuit with reset and set inputs and low work level of control input, which satisfies strictly self-timed requirements.

FIG. 29 presents the storage unit of two-stage self-timed trigger circuit with reset 19 and set 20 inputs and low work level of control input 8, which satisfies strictly self-timed requirements. This variant of storage unit differs from circuit in FIG. 27 by that fourth inputs connected to the set input 20 are added to first and fourth OR input groups of OR-AND-NOT element 28. Presetting "0" and "1" is performed as described above. But now output of indication element OR-AND-NOT 28 does not change during presetting, as all its input groups are locked by high level on control input 8 and on set or reset input. Indication of preset termination is realized by additional logic indicating transition of the data output 5 into state "1" at setting, or transition of the inverse data output 2_6 of the storage unit into state "1" at resetting.

Simultaneous applying high level onto inputs 19 and 20 is prohibited.

Self-timed preset requires an indication of transition termination for all trigger's components at preset process. It was noted above that for this it is necessary and sufficient to indicate an output of that trigger's element, which switches at last order. Such an element is always single in suggested implementations of single-stage and two-stage triggers.

Figure 30:
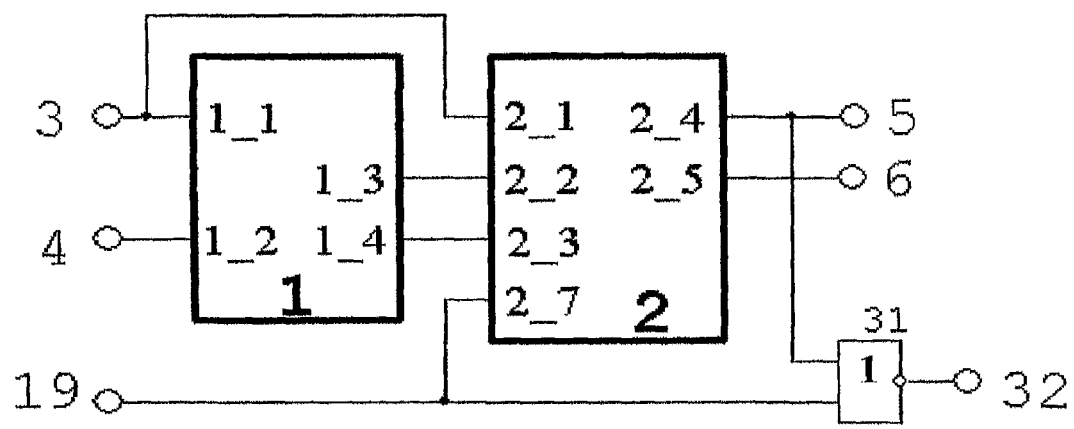
FIG. 30 presents the self-timed trigger circuit with single-rail data input, control input with low work state, and with reset input.

FIG. 30 presents the self-timed trigger circuit with single-rail data input, control input with low work state, and with reset input. It differs from the circuit in FIG. 2 by that in addition it contains reset input 19, OR-NOT element 31 and second indication output 32, and storage unit has reset input 2_7, at that trigger's reset input 19 is connected to the reset input 2_7 of the storage unit and to second input of OR-NOT element 31, whose first input is connected to the trigger's data output 5, and its output is connected to trigger's second indication output 32.

Circuit operates as follows. Let trigger is storing state "1" at its data output 5. For setting, high level is applied to the control input 4, while low level is applied to reset input 19. At that element forming data output of the storage unit and trigger implemented in accordance with circuit in FIG. 10 or in FIG. 20, switches into state "0" at last order. Only after this OR-NOT element 31 switches into state "1" fixing termination of trigger resetting.

Figure 31:
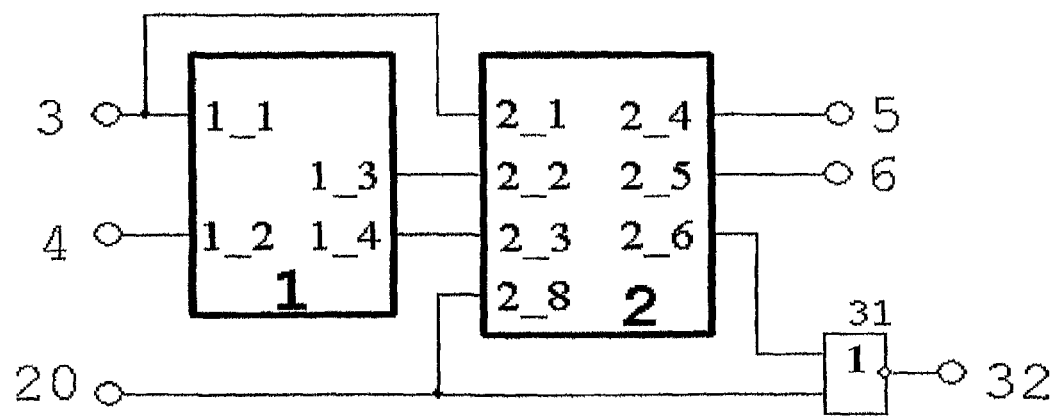
FIG. 31 shows the self-timed trigger circuit with single-rail data input, control input with low work state, and with set input.

FIG. 31 shows the self-timed trigger circuit with single-rail data input, control input with low work state, and with set input. It differs from the circuit in FIG. 2 by that it contains set input 20, OR-NOT element 31 and second indication output 32, and storage unit has set input 2_8, at that trigger's set input 20 is connected to the set input 2_8 of the storage unit and to second input of OR-NOT element 31, whose first input is connected to inverse data output 2_6 of the storage unit, and its output is connected to trigger's second indication output 32.

Circuit operates as follows. Let trigger is storing state "0" at its data output. For setting, high level is applied to the control input 4, while low level is applied to set input 20. At that element forming inverse data output of the storage unit and trigger implemented in accordance with circuit in FIG. 11 or in FIG. 21, switches into state "1" at last order. Only after this OR-NOT element 31 switches into state "1" fixing termination of trigger setting.

Figure 32:
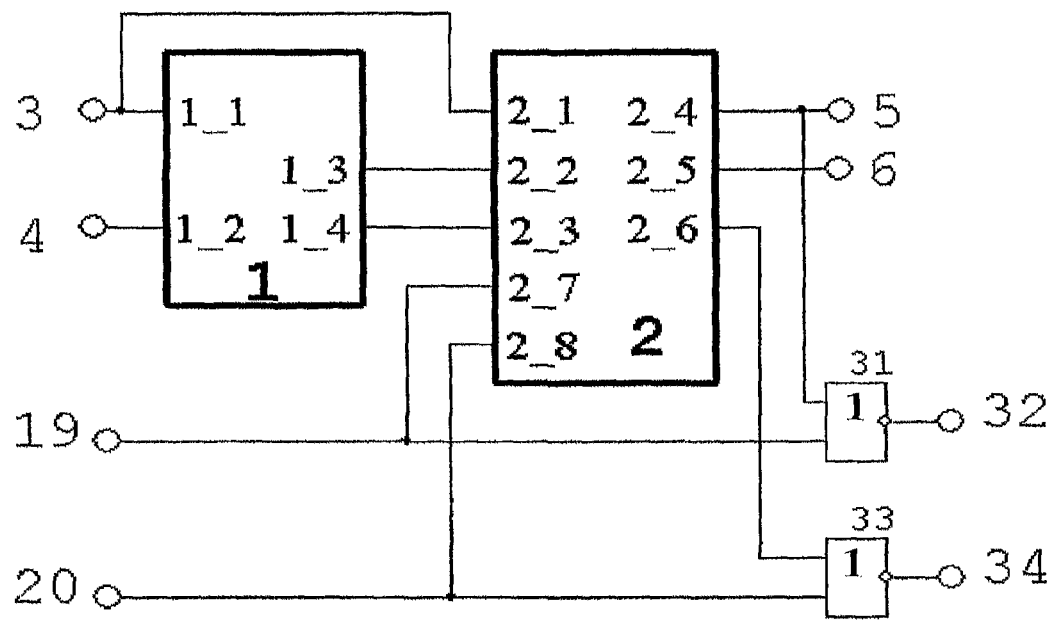
FIG. 32 shows the self-timed trigger circuit with single-rail data input, control input with low work state, and with reset and set inputs.

FIG. 32 shows the self-timed trigger circuit with single-rail data input, control input with low work state, and with reset and set inputs. It differs from the circuit in FIG. 30 by that it contains set input 20, OR-NOT element 33 and third indication output 34, and storage unit has set input 2_8, at that trigger's set input 20 is connected to the set input 2_8 of the storage unit and to second input of OR-NOT element 33, whose first input is connected to inverse data output 2_6 of the storage unit, and its output is connected to trigger's second indication output 34. A presence of two indication elements OR-NOT 31 and 33 allows for independent indicating preset of "0" and "1". Presetting "0" and "1" is performed as described above.

Figure 33:
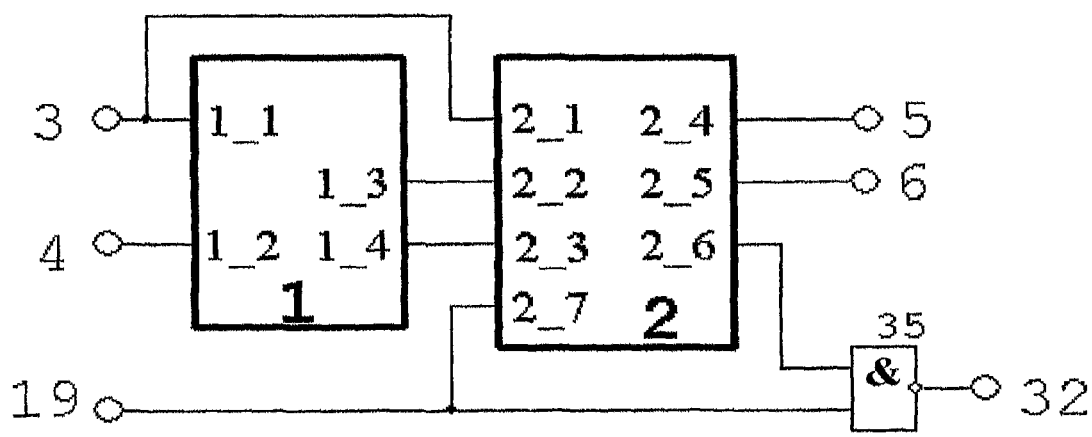
FIG. 33 presents the self-timed trigger circuit with single-rail data input, control input with high work state, and with reset input.

FIG. 33 presents the self-timed trigger circuit with single-rail data input, control input with high work state, and with reset input. It differs from the circuit in FIG. 2 by that it contains reset input 19, AND-NOT element 35 and second indication output 32, and storage unit has reset input 2_7, at that trigger's reset input 19 is connected to the reset input 2_7 of the storage unit and to second input of AND-NOT element 35, whose first input is connected to inverse data output 2_6 of the storage unit, and its output is connected to trigger's second indication output 32.

Circuit operates as follows. Let trigger is storing state "1" at its data output. For resetting, low level is applied to the control input 4, while high level is applied to reset input 19. At that element forming inverse data output of the storage unit and trigger implemented in accordance with circuit in FIG. 13 or in FIG. 27, switches into state "1" at last order. Only after this AND-NOT element 35 switches into state "0" fixing termination of trigger resetting.

Figure 34:
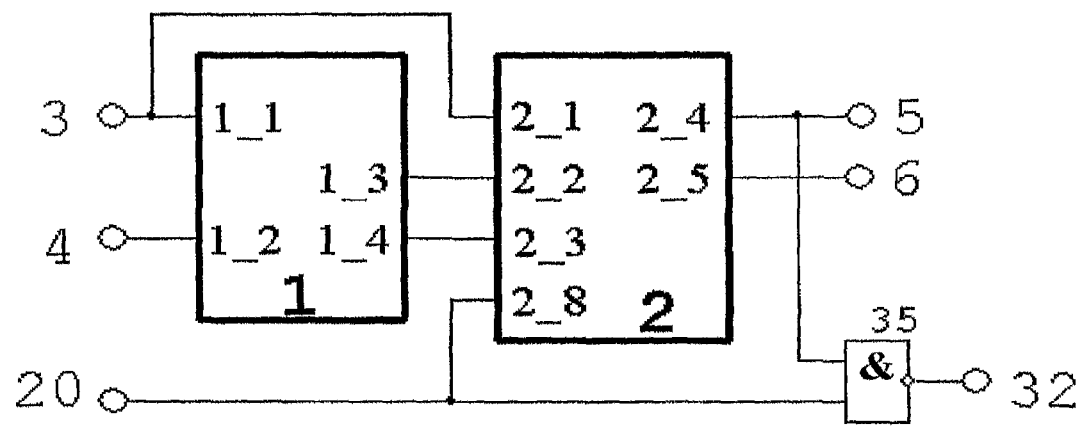
FIG. 34 presents the self-timed trigger circuit with single-rail data input, control input with high work state, and with set input.

FIG. 34 presents the self-timed trigger circuit with single-rail data input, control input with high work state, and with set input. It differs from the circuit in FIG. 2 by that it contains set input 20, AND-NOT element 35 and second indication output 32, and storage unit has set input 2_8, at that trigger's set input 20 is connected to the set input 2_8 of the storage unit and to second input of AND-NOT element 35, whose first input is connected to the trigger's data output 5, and its output is connected to trigger's second indication output 32.

Circuit operates as follows. Let trigger is storing state "0" at its data output. For setting, low level is applied to the control input 4, while high level is applied to set input 20. At that element forming data output of the storage unit and trigger implemented in accordance with circuit in FIG. 14 or in FIG. 28, switches into state "1" at last order. Only after this AND-NOT element 35 switches into state "0" fixing termination of trigger setting.

Figure 35:
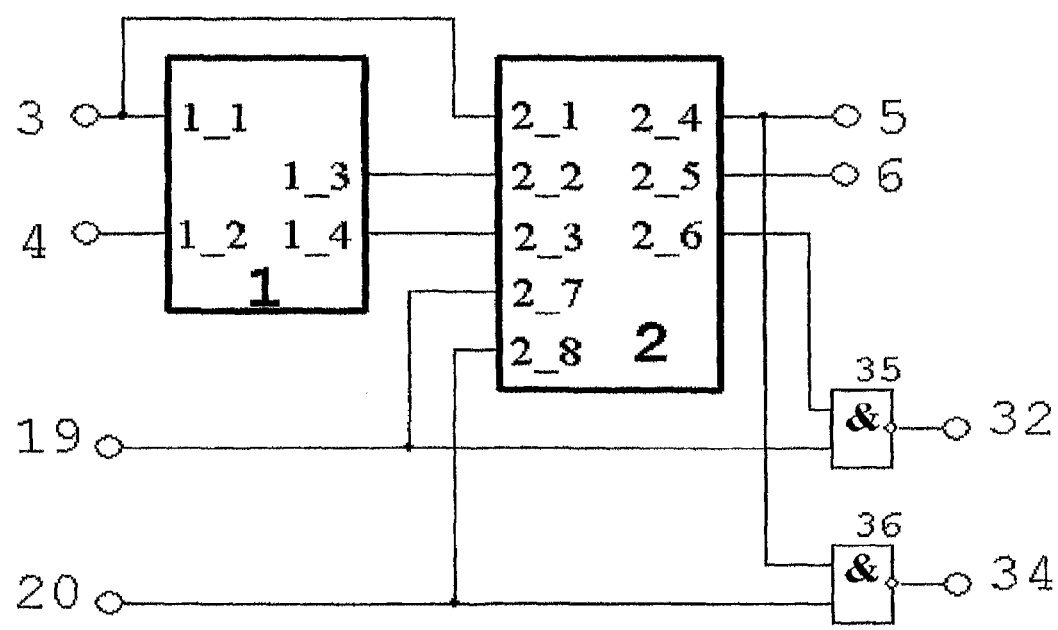
FIG. 35 presents the self-timed trigger circuit with single-rail data input, control input with high work state, and with reset and set inputs.

FIG. 35 presents the self-timed trigger circuit with single-rail data input, control input with high work state, and with reset and set inputs. It differs from the circuit in FIG. 33 by that it contains set input 20, AND-NOT element 36 and third indication output 34, and storage unit has set input 2_8, at that trigger's set input 20 is connected to the set input 2_8 of the storage unit and to second input of AND-NOT element 36, whose first input is connected to the trigger's data output 5, and its output is connected to trigger's third indication output 34. Presetting "0" and "1" is performed as described above.

At building multi-bit unit on base of the suggested self-timed trigger circuit with self-timed preset, outputs of indication elements OR-NOT 31, 33 are collected by AND-NOT element, which is separate for each preset type ("0" or "1"). This AND-NOT element forms total signal indicating preset termination in an entire multi-bit unit. In contrary, outputs of indication elements AND-NOT 35, 36 are collected by OR-NOT element, which also is separate for each preset type ("0" or "1").

Total preset "0" and/or "1" indication subcircuit can be transformed to any type, as well as to any implementation basis by means of Boolean algebra rules.

At designing self-timed circuits, it is very important to provide a correct interaction between components and blocks of the circuit. An example of such interaction organization between the offered self-timed trigger circuit with single-rail data input and an external environment is described below.

An event model lies in basis of the self-timed circuit operation, so an adequate mean described its work is a signal graph (SG), SG simultaneously is a formal mean for designed device specification, an evident mean for functional description and visual mean proving self-timed character of the device.

Figure 36:
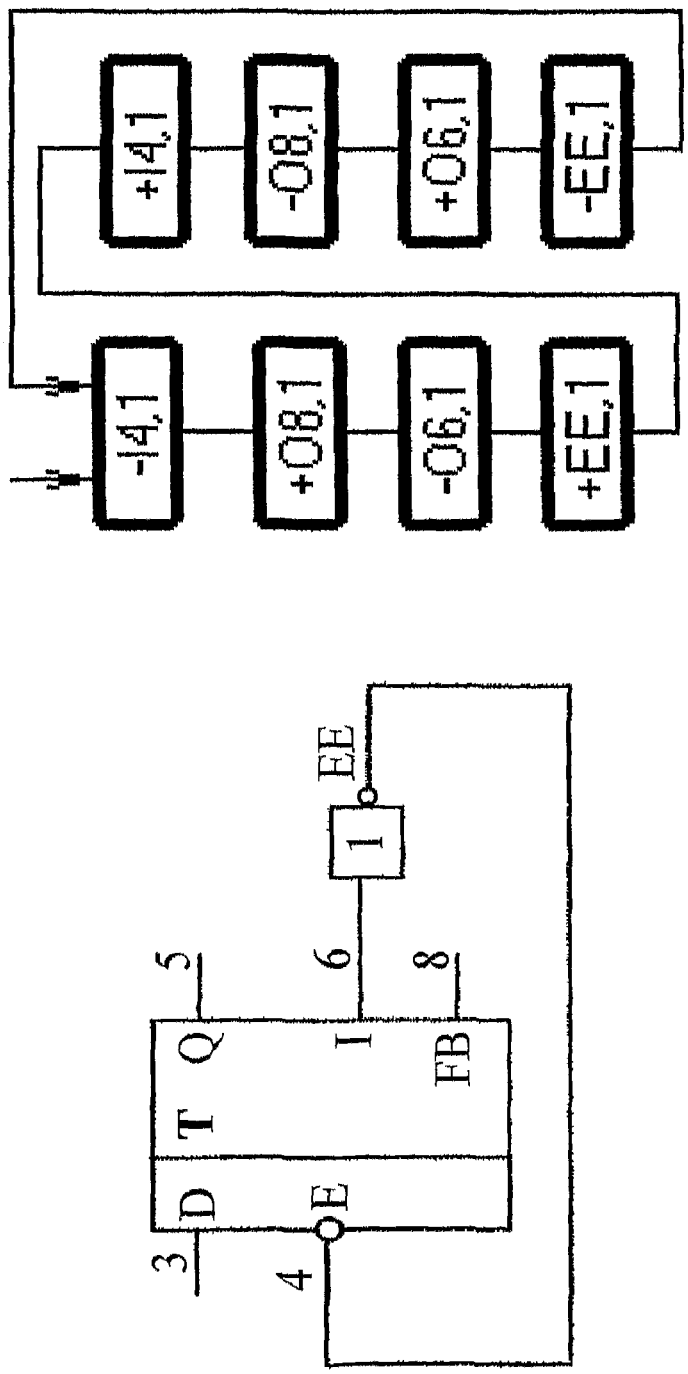
FIG. 36 presents a signal graph (SG) of operation for the trigger shown in FIG. 9, in repeated zero writing mode.

FIG. 36 presents SG for the trigger shown in FIG. 9, consisting of conversion unit and storage unit, in repeated zero writing mode. Here self-timed latch is shown together with an external environment (EE). In this case EE is represented by inverter providing continuous alternation of operation phases of the trigger: just after work phase termination (low level of indication output O6), EE initiates spacer phase of the trigger (switch into mode of keeping data on output O5). The sign "+" in a signal name is used for notation of setting high signal level, and sign "−"—for setting low level. The names of signals correspond to numeration of elements and pins in FIG. 9. The characters "I" and "O" in signal name designate inputs and outputs of the trigger. "D" character designates output of the appropriate element, which does not connect directly to any trigger's pin. Initial state of the trigger:
  bistable cell: O5=0; D14=1 (trigger stores state "0");
  input states: I3=0 (single-rail data input), I4=1 (control input), D9=1;
  indicator state: O6=1;
  external environment state: EE=0;
  process initialization: I4→0 (sign "−" in signal graph).

As it is visible from FIG. 36, setting low level on control input (−I4,1) causes changing state of AND-OR-NOT element 10 in FIG. 9 (O8). As soon as its transition terminates (high level on its output), changing state of AND-OR-NOT element 15 in FIG. 9 (output O6) is initiated. Let's remind once again that duration of transition of any element is not limited.

From SG in FIG. 36 it is visible, that there are no changes of output state of bistable cell (outputs O5 and D14), as SG reflects only change of states, while in FIG. 36 we consider the mode of repeated zero writing into the trigger, when state of trigger itself doesn't change.

As it is visible from FIG. 36, an indication signal O6 (output of element 15 in FIG. 9) changes only after transitions in all components of the self-timed trigger circuit have already terminated. It is visual confirmation of self-timed character of the considered trigger.

Figure 37:
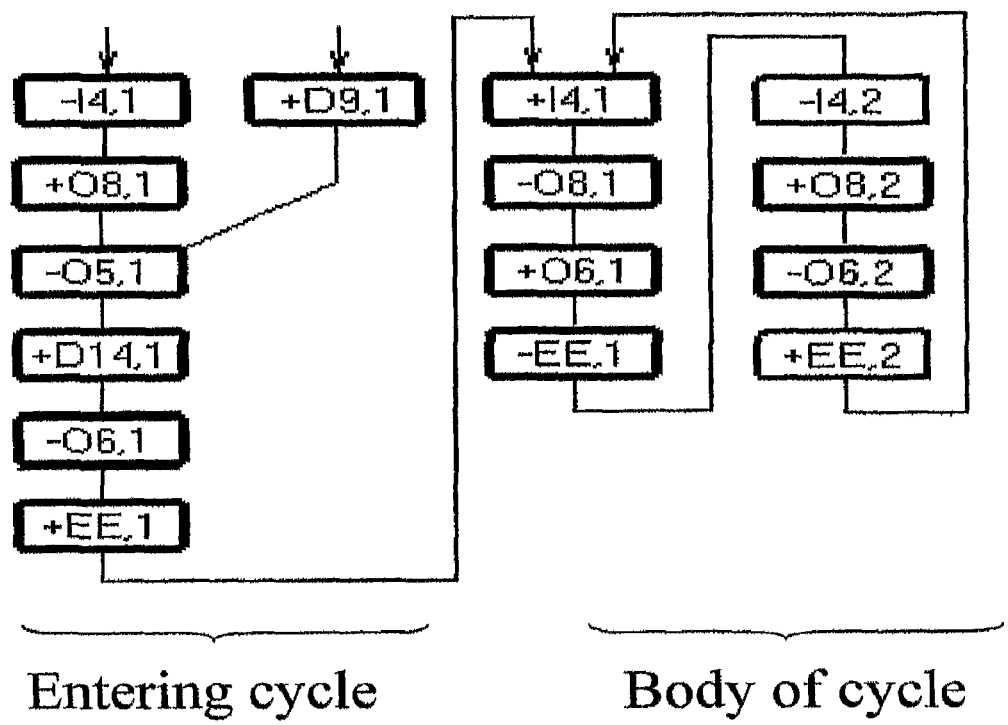
FIG. 37 presents the SG of writing zero into the self-timed latch storing a state of "1".

FIG. 37 presents SG of writing zero into the self-timed latch storing a state of "1". Initial state of the trigger:

bistable cell: O5=1; D14=0 (trigger stores state "1");
input states: I3=0 (single-rail data input), I4=1 (control input), D9=0;
indicator state: O6=1;
external environment state: EE=0;
process initialization: D9→1 (sign "+" in signal graph); I4→0 (sign "−" in signal graph).

It is visible, that components of bistable cell (outputs O5 and D14) and indicator (O6) change at stage "Entering cycle". At stage "Cycle body" a state of the trigger does not change, therefore only indicator (O6) and element D10 forming control signal switch.

Figure 38:
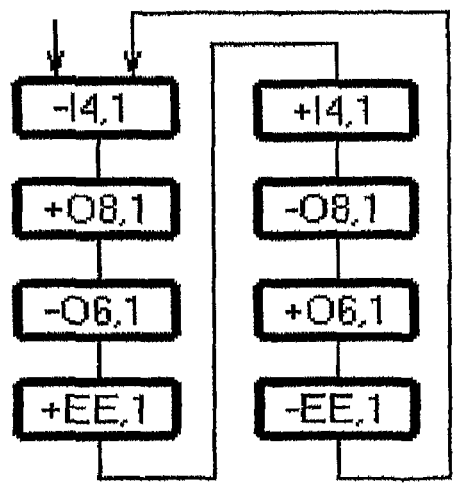
FIG. 38 presents the SG's of repeated one writing into the trigger and one writing at current cycle after zero writing at previous cycle.
Figure 39:
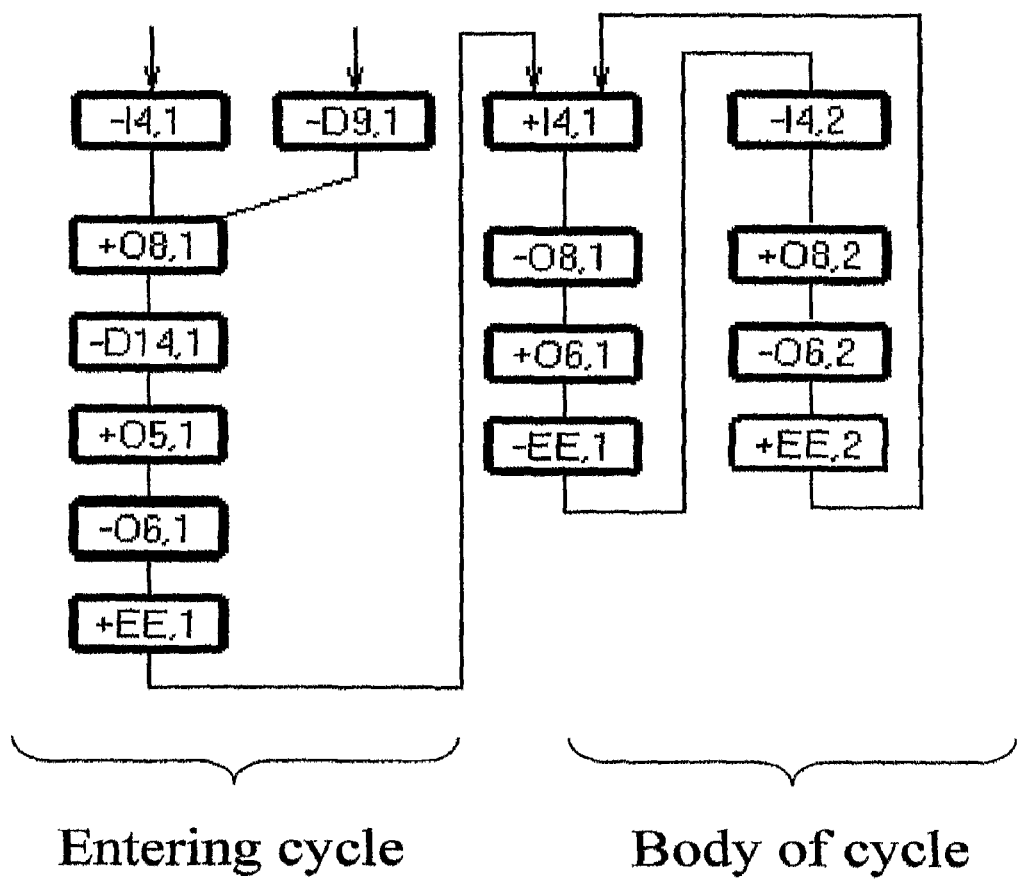
FIG. 39 presents the SG's of repeated one writing into the trigger and one writing at current cycle after zero writing at previous cycle.

FIG. 38 and FIG. 39 present SG's of repeated one writing into the trigger and one writing at current cycle after zero writing at previous cycle. The circuit at that works similarly to above considered cases.

Thus, represented SG's prove a self-timed character of the suggested solution.

The terms "single-rail" and "paraphase" used in the text of this invention are defined as follows. Signal is considered as "single-rail", if it is single and requires inverter for obtaining an opposite (inverse) value. Signal is considered as "paraphase", if a pair of signals represents it. In a static state, after termination of element switch processes in the circuit two components of a paraphase signal have opposite values. As a result a paraphase signal {X, XB} can be in one of two work states: {X=0, XB=1} or {X=1, XB=0}. The transition from one static state to complementary state occurs through the same dynamic state, {1,1} or {0,0}, determined by a type of elements forming this paraphase signal. Typical member of device class with a paraphase output is a usual synchronous trigger with cross feedback, for example, RS-trigger.

INDUSTRIAL APPLICABILITY

The self-timed trigger circuit with single-rail data input refers to pulse and computational technique and may be used for designing of the self-timed trigger circuit, register and computational units, as well as in digital signal processing system as both storage cell and interface between synchronous and self-timed parts of one design.

REFERENCES

[1] Шило В.Л. Популярные цифровые микро схемы : Справочник. 2-е изд., испр., Челябинск : Металлургия , Челябинское отд., 1989., рис .1.50а..

[2] Астахановский А.Г., Варшавский В.И., Мараховский В.Б. и др. Апериодические автоматы. // Под ред. В.И.Варшавского., М.: Наука, 1976., рис .2.76 (single-stage trigger with paraphase data input and writing down permission by high level of control input).

[3] Астахановский А.Г., Варшавский В.И., Мараховский В.Б. и др. Апериодические автоматы // Под ред. В.И.Варшавского.—М.: Наука, 1976,—рис .2.7а (single-stage trigger with paraphase data input and writing down permission by low level of control input).

[4] Астахановский А.Г., Варшавский В.И., Мараховский В.Б. и др. Апериодические автоматы . // Под ред. В.И.Варшавского —М.: Наука. 1976.— рис . 21ба (two-stage trigger with paraphase data input and writing down permission by high level of control input).

[5] Астахановский А.Г., Варшавский В.И., Мараховский В.Б. и др. Апериодические автоматы . // Под ред. В.И.Варшавского.—М.: Наука, 1976.—рис . 2.16б (two-stage trigger with paraphase data input and writing down permission by low level of control input).

The invention claimed is:

1. A self-timed trigger circuit with single-rail data input comprising a storage unit, a single-rail data input, a control input, a data output and an indication output, the storage unit having direct and inverse components of a paraphase data input, control input, data output and indication output, the data output of the storage unit is connected to the trigger's data output, the direct component of the paraphase data input of the storage unit is connected to the trigger's single-rail data input, the indication output of the storage unit is connected to the trigger's indication output, wherein a conversion unit is added which converts the control input and the single-rail data input and has data input, control input, data output and control output, and the data input of the conversion unit is connected to the trigger's single-rail data input, the control input of the conversion unit is connected to the trigger's control input, the data output of the conversion unit is connected to the inverse component of the paraphase data input of the storage unit, the control output of the conversion unit is connected to the control input of the storage unit.

2. The self-timed trigger circuit with single-rail data input according to claim 1, wherein an inverse data output is added to both the storage unit and trigger, and these outputs are connected to each other.

3. The self-timed trigger circuit with single-rail data input according to claim 1, wherein feedback output connected to the control output of the conversion unit is added to the trigger.

4. The self-timed trigger circuit with single-rail data input according to claim 1, wherein the conversion unit comprises an inverter and an AND-OR-NOT element, an input of the inverter is connected to the data input of the conversion unit and to a second input of a first AND input group of the AND-OR-NOT element, and an output of the inverter is connected to the data output of the conversion unit and to the first input of the first AND input group of the AND-OR-NOT element, the control input of the conversion unit is connected to an input of a second AND input group of the AND-OR-NOT element, whose output is connected to the control output of the conversion unit.

5. The self-timed trigger circuit with single-rail data input according to claim 1, wherein the conversion unit comprises an inverter and an OR-AND-NOT element, the input of the inverter is connected to the data input of the conversion unit and to a second input of a first OR input group of the OR-AND-NOT element, and an output of the inverter is connected to a data output of the conversion unit and to a first input of the first OR input group of the OR-AND-NOT element, the control input of the conversion unit is connected to an input of a second OR input group of the OR-AND-NOT element, whose output is connected to the control output of the conversion unit.

6. The self-timed trigger circuit with single-rail data input according to claim 4, the storage unit comprising three AND-OR-NOT elements, the inverse component of the paraphase data input of storage unit is connected to a first input of both a first AND input group of a first AND-OR-NOT element and a second AND input group of a third AND-OR-NOT element, the direct component of the paraphase data input of the storage unit is connected to the first input of the first AND input groups of both second and third AND-OR-NOT elements, the control input of the storage unit is connected to the second input of the first AND input groups of the first and second AND-OR-NOT elements and to a third input of first and second AND input groups of the third AND-OR-NOT element, the output of the first AND-OR-NOT element is connected to an input of a second AND input group of the second AND-OR-NOT element, to the second input of the first AND input group of the third AND-OR-NOT element and to the data output of the storage unit, the output of the second AND-OR-NOT element is connected to an input of the second AND input group of the first AND-OR-NOT element and to a second input of the second AND input group of the third AND-OR-NOT element, an output of the third AND-OR-NOT element is connected to the indication output of the storage unit, wherein a reset input and an inverse data output of the storage unit are added, and a second input connected to the reset input is inserted into the second AND input group of the second AND-OR-NOT element of the storage unit, and the inverse data output of the storage unit is connected to an output of the second AND-OR-NOT element.

7. The self-timed trigger circuit with single-rail data input according to claim 4, the storage unit comprises three AND-OR-NOT elements, the inverse component of the paraphase data input of the storage unit is connected to a first input of both first AND input group of a first AND-OR-NOT element and a second AND input group of a third AND-OR-NOT element, the direct component of the paraphase data input of the storage unit is connected to the first input of the first AND input group of both second and third AND-OR-NOT elements, the control input of the storage unit is connected to the second input of a first AND input groups of first and second AND-OR-NOT elements and to a third input of the first and second AND input groups of the third AND-OR-NOT element, the output of the first AND-OR-NOT element is connected to an input of the second AND input group of the second AND-OR-NOT element, to the second input of the first AND input group of the third AND-OR-NOT element and to the data output of the storage unit, an output of the second AND-OR-NOT element is connected to an input of the second AND input group of the first AND-OR-NOT element and to the second input of the second AND input group of the third AND-OR-NOT element, the output of the third AND-OR-NOT element is connected to the indication output of the storage unit, wherein a set input and an inverse data output of the storage unit are added, and the second input connected to the set input is inserted into the second AND input group of the first AND-OR-NOT element of the storage unit, and the inverse data output of the storage unit is connected to an output of the second AND-OR-NOT element.

8. The self-timed trigger circuit with single-rail data input according to claim 6, wherein the set input is added, and the second input connected to the set input is inserted into the second AND input group of the first AND-OR-NOT element of the storage unit.

9. The self-timed trigger circuit with single-rail data input according to claim 5, the storage unit comprises three OR-AND-NOT elements, the inverse component of the paraphase data input of the storage unit is connected to the first input of both a first OR input group of the first OR-AND-NOT element and a second OR input group of the third OR-AND-NOT element, the direct component of the paraphase data input of the storage unit is connected to the first input of the first OR input group of both second and third OR-AND-NOT elements, the control input of the storage unit is connected to the second input of the first OR input group of the first and second OR-AND-NOT elements and to a third input of the first and second OR input groups of the third OR-AND-NOT element, an output of the first OR-AND-NOT element is connected to an input of the second OR input group of the second OR-AND-NOT element, to the second input of the first OR input group of the third OR-AND-NOT element and to the data output of the storage unit, the output of the second OR-AND-NOT element is connected to an input of the second OR input group of the first OR-AND-NOT element, and to the second input of the second OR input group of the third OR-AND-NOT element, the output of the third OR-AND-NOT element is connected to the indication output of the storage unit, wherein a reset input and the inverse data output of the storage unit are added, and the second input connected to the reset input is inserted into the second OR input group of the first OR-AND-NOT element of the storage unit, and the inverse data output of the storage unit is connected to an output of the second OR-AND-NOT element.

10. The self-timed trigger circuit with single-rail data input according to claim 5, the storage unit comprising three OR-AND-NOT elements, the inverse component of the paraphase data input of storage unit is connected to the first input of both a first OR input group of a first OR-AND-NOT element and a second OR input group of a third OR-AND-NOT element, the direct component of the paraphase data input of the storage unit is connected to the first input of the first OR input group of both second and third OR-AND-NOT elements, the control input of the storage unit is connected to the second input of the first OR input group of both first and second OR-AND-NOT elements and to a third input of both first and second OR input groups of the third OR-AND-NOT element, an output of a first OR-AND-NOT element is connected to an input of a second OR input group of the second OR-AND-NOT element, to a second input of the first OR input group of the third OR-AND-NOT element and to the data output of the storage unit, the output of the second OR-AND-NOT element is connected to an input of the second OR input group of the first OR-AND-NOT element and to the second input of the second OR input group of the third OR-AND-NOT element, the output of the third OR-AND-NOT element is connected to the indication output, wherein a set input and an inverse data output of the storage unit are added, and the second input connected to set input is inserted into the second OR input group of the second OR-AND-NOT element of the storage unit, and the inverse data output of the storage unit is connected to an output of the second OR-AND-NOT element.

11. The self-timed trigger circuit with single-rail data input according to claim 9, wherein the set input is added, and the second input connected to the set input is inserted into the second OR input group of the second OR-AND-NOT element of the storage unit.

12. The self-timed trigger circuit with single-rail data input according to claim 4, the storage unit comprises three AND-OR-NOT elements, two OR-AND-NOT elements, the direct component of the paraphase data input of the storage unit is connected to the first input of a first AND input group of a first AND-OR-NOT element and to a second input of a third AND input group of the third AND-OR-NOT element, the inverse component of the paraphase data input of the storage unit is connected to the first input of the first AND input group of the second AND-OR-NOT element and to a second input of a second AND input group of the third AND-OR-NOT element, the control input of the storage unit is connected to a second input of the first AND input group of the first and second AND-OR-NOT elements, to a second input of a first OR input group of the first and second OR-AND-NOT elements, to a third input of a second AND input group and to a first input of the third AND input group of the third AND-OR-NOT element, the output of the first AND-OR-NOT element is connected to both the second input of the first AND input group and to the first input of the second AND input group of the third AND-OR-NOT element, to an input of the second AND input group of the second AND-OR-NOT element and to a first input of the first OR input group of the first OR-AND-NOT element, whose output is connected to an input of a second OR input group of the second OR-AND-NOT element, to the first input of the first AND input group of the third AND-OR-NOT element and to the data output of the storage unit, an output of the second AND-OR-NOT element is connected to both a third input of the third AND input group and to a first input of a fourth AND input group of the third AND-OR-NOT element, to an input of the second AND input group of the first AND-OR-NOT element and to the first input of the first OR input group of the second OR-AND-NOT element, whose output is connected to an input of the second OR input group of the first OR-AND-NOT element and to a second input of the fourth AND input group of the third AND-OR-NOT element, an output of the third AND-OR-NOT element is connected to the indication output of the storage unit, wherein a reset input and an inverse data output of the storage unit are added, and a second input connected to reset input is inserted into the second AND input group of the first AND-OR-NOT element of the storage unit, and the inverse data output of the storage unit is connected to an output of the second OR-AND-NOT element.

13. The self-timed trigger circuit with single-rail data input according to claim 4, the storage unit comprises three AND-OR-NOT elements, two OR-AND-NOT elements, the direct component of the paraphase data input of the storage unit is connected to a first input of a first AND input group of the first AND-OR-NOT element and to a second input of a third AND input group of the third AND-OR-NOT element, the inverse component of the paraphase data input of the storage unit is connected to a first input of a first AND input group of a second AND-OR-NOT element and to a second input of a second AND input group of a third AND-OR-NOT element, the control input of the storage unit is connected to a second input of a first AND input group of first and second AND-OR-NOT elements and to a second input of a first OR input group of first and second OR-AND-NOT elements, to a third input of the second AND input group and to a first input of a third AND input group of the third AND-OR-NOT element, an output of the first AND-OR-NOT element is connected to a second input of the first AND input group and to a first input of the second AND input group of the third AND-OR-NOT element, to an input of the second AND input group of the second AND-OR-NOT element and to a first input of the first OR input group of the first OR-AND-NOT element, whose output is connected to an input of a second OR input group of the second OR-AND-NOT element, to a first input of a first AND input group of the third AND-OR-NOT element and to the data output of the storage unit, an output of the second AND-OR-NOT element is connected to a third input of a third AND input group and to a first input of a fourth AND input group of the third AND-OR-NOT element, to an input of the second AND input group of the first AND-OR-NOT element and to a first input of the first OR input group of the second OR-AND-NOT element, whose output is connected to an input of a second OR input group of the first OR-AND-NOT element and to a second input of the fourth AND input group of the third AND-OR-NOT element, an output of the third AND-OR-NOT element is connected to the indication output of the storage unit, characterized by that wherein a set input and inverse data output of the storage unit are added, and a second input connected to the set input is inserted into the second AND input group of the second AND-OR-NOT element of the storage unit, and the inverse data output of the storage unit is connected to an output of the second OR-AND-NOT element.

14. The self-timed trigger circuit with single-rail data input according to claim 12, wherein a set input is added, and a second input connected to the set input is inserted into the second AND input group of the second AND-OR-NOT element of the storage unit.

15. The self-timed trigger circuit with single-rail data input according to claim 12, wherein a third input connected to a reset input is inserted into first and fourth AND input groups of the third AND-OR-NOT element of the storage unit.

16. The self-timed trigger circuit with single-rail data input according to claim 13, wherein a third input connected to the set input is inserted into first and fourth AND input groups of the third AND-OR-NOT element of the storage unit.

17. The self-timed trigger circuit with single-rail data input according to claim 14, wherein third and fourth inputs connected to the reset and set inputs respectively are inserted into both first and fourth AND input groups of the third AND-OR-NOT element of the storage unit.

18. The self-timed trigger circuit with single-rail data input according to claim 5, the storage unit comprises three OR-AND-NOT elements, two AND-OR-NOT elements, the direct component of the paraphase data input of the storage unit is connected to a first input of a first OR input group of the first OR-AND-NOT element and to a second input of a third OR input group of the third OR-AND-NOT element, the inverse component of the paraphase data input of the storage unit is connected to a first input of a first OR input group of the second OR-AND-NOT element and to a second input of a second OR input group of the third OR-AND-NOT element, the control input of the storage unit is connected to a second input of the first OR input group of both first and second OR-AND-NOT elements, to a second input of a first AND input group of both first and second AND-OR-NOT elements, to a third input of the second OR input group and to a first input of the third OR input group of the third OR-AND-NOT element, an output of a first OR-AND-NOT element is connected to a second input of the first OR input group and to a first input of the second OR input group of the third OR-AND-NOT element, to an input of the second OR input group of the second OR-AND-NOT element and to a first input of the first AND input group of the first AND-OR-NOT element, whose output is connected to an input of the second AND input group of the second AND-OR-NOT element, to a first input of a first OR input group of the third OR-AND-NOT element and to the data output of the storage unit, an output of a second OR-AND-NOT element is connected to a third input of the third OR input group and to a first input of a fourth OR input group of the third OR-AND-NOT element, to an input of the second OR input group of the first OR-AND-NOT element and to a first input of the first AND input group of the second AND-OR-NOT element, whose output is connected to an input of the second AND input group of the first AND-OR-NOT element and to a second input of a fourth OR input group of the third OR-AND-NOT element, an output of a third OR-AND-NOT element is connected to the indication output of the storage unit, characterized by that a reset input and an inverse data output of the storage unit are added, and a second input connected to the reset input is inserted into a second OR input group of the second OR-AND-NOT element of the storage unit, and the inverse data output of the storage unit is connected to an output of the second AND-OR-NOT element.

19. The self-timed trigger circuit with single-rail data input according to claim 5, the storage unit comprising three OR-AND-NOT elements, two AND-OR-NOT elements, the direct component of the paraphase data input of the storage unit is connected to a first input of a first OR input group of the first OR-AND-NOT element and to a second input of a third OR input group of the third OR-AND-NOT element, the inverse component of the paraphase data input of the storage unit is connected to a first input of a first OR input group of the second OR-AND-NOT element and to a second input of a second OR input group of the third OR-AND-NOT element, the control input of the storage unit is connected to a second input of the first OR input group of both first and second OR-AND-NOT elements, to a second input of a first AND input group of both first and second AND-OR-NOT elements, to a third input of the second OR input group and to a first input of the third OR input group of the third OR-AND-NOT element, an output of a first OR-AND-NOT element is connected to a second input of the first OR input group and to a first input of a second OR input group of the third OR-AND-NOT element, to an input of a second OR input group of a second OR-AND-NOT element and to the first input of the first AND input group of the first AND-OR-NOT element, whose output is connected to an input of a second AND input group of a second AND-OR-NOT element, to a first input of a first OR input group of the third OR-AND-NOT element and to the data output of the storage unit, output of the second OR-AND-NOT element is connected to a third input of a third OR input group and to a first input of a fourth OR input group of the third OR-AND-NOT element, to an input of the second OR input group of the first OR-AND-NOT element and to a first input of the first AND input group of the second AND-OR-NOT element, whose output is connected to an input of the second AND input group of the first AND-OR-NOT element and to a second input of the fourth OR input group of the third OR-AND-NOT element, output of the third OR-AND-NOT element is connected to the indication output of the storage unit, wherein a set input and an inverse data output of the storage unit are added, and a second input connected to the set input is inserted into the second OR input group of the first OR-AND-NOT element of the storage unit, and the inverse data output of the storage unit is connected to an output of the second AND-OR-NOT element.

20. The self-timed trigger circuit with single-rail data input according to claim 18, wherein the set input is added, and the second input connected to the set input is inserted into the second OR input group of the first OR-AND-NOT element of the storage unit.

21. The self-timed trigger circuit with single-rail data input according to claim 18, wherein a third input connected to the reset input is inserted into both first and fourth OR input groups of the third OR-AND-NOT element of the storage unit.

22. The self-timed trigger circuit with single-rail data input according to claim 19, wherein a third input connected to the set input is inserted into both first and fourth OR input groups of the third OR-AND-NOT element of the storage unit.

23. The self-timed trigger circuit with single-rail data input according to claim 20, wherein third and fourth inputs connected to reset and set inputs respectively are inserted into both first and fourth OR input groups of the third OR-AND-NOT element of the storage unit.

24. The self-timed trigger circuit with single-rail data input according to claim 6, wherein a second indication output and an OR-NOT element are added, and first and second inputs of the OR-NOT element are connected to the data output of the storage unit and to reset input respectively, and output of the OR-NOT element is connected to the second indication output.

25. The self-timed trigger circuit with single-rail data input according to claim 7, wherein a second indication output and an OR-NOT element are added, and first and second inputs of OR-NOT element are connected to the inverse data output of the storage unit and to set input respectively, and output of the OR-NOT element is connected to the second indication output.

26. The self-timed trigger circuit with single-rail data input according to claim 8, wherein second and third indication outputs and two OR-NOT elements are added, the first and second inputs of a first OR-NOT element are connected to the data output of the storage unit and to the reset input respectively, and an output of the first OR-NOT element is connected to the second indication output, while first and second inputs of a second OR-NOT element are connected to the inverse data output of the storage unit and to the set input respectively, and output of the second OR-NOT element is connected to the third indication output.

27. The self-timed trigger circuit with single-rail data input according to claim 9, wherein a second indication output and an AND-NOT element are added to a trigger, and first and second inputs of the AND-NOT element are connected to the inverse data output of the storage unit and to the reset input respectively, and an output of the AND-NOT element is connected to the second indication output.

28. The self-timed trigger circuit with single-rail data input according to claim 10, wherein a second indication output and an AND-NOT element are added to a trigger, and first and second inputs of the AND-NOT element are connected to the data output of the storage unit and to the set input respectively, and an output of AND-NOT element is connected to the second indication output.

29. The self-timed trigger circuit with single-rail data input according to claim 11, wherein second and third indication outputs and two AND-NOT elements are added, first and second inputs of a first AND-NOT element are connected to the inverse data output of the storage unit and to the reset input respectively, and an output of the first AND-NOT element is connected to the second indication output, while first and second inputs of a second AND-NOT element are connected to the data output of the storage unit and to set input respectively, and an output of the second AND-NOT element is connected to the third indication output.

* * * * *